(12) United States Patent
Saito et al.

(10) Patent No.: US 8,809,853 B2
(45) Date of Patent: Aug. 19, 2014

(54) SEMICONDUCTOR DEVICE

(75) Inventors: Toshihiko Saito, Kanagawa (JP);
Kiyoshi Kato, Kanagawa (JP); Atsuo Isobe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 77 days.

(21) Appl. No.: 13/409,316

(22) Filed: Mar. 1, 2012

(65) Prior Publication Data
US 2012/0223306 A1 Sep. 6, 2012

(30) Foreign Application Priority Data

Mar. 4, 2011 (JP) ................................ 2011-048103

(51) Int. Cl.
*H01L 29/78* (2006.01)
*H01L 29/772* (2006.01)

(52) U.S. Cl.
USPC 257/43; 257/57; 257/E29.242; 257/E29.255; 365/46; 365/149; 365/189.05

(58) Field of Classification Search
CPC .............. G11C 11/403; G11C 11/4045; H01L 21/8239; H01L 27/0688; H01L 27/1214; H01L 27/11521; H01L 27/11551
USPC ......... 257/43, 57, E29.242, E29.255; 326/46, 326/149, 189.05; 365/46, 149, 189.05
See application file for complete search history.

(56) References Cited

U.S. PATENT DOCUMENTS

| 4,466,081 A | 8/1984 | Masuoka |
| 5,612,563 A | 3/1997 | Fitch et al. |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Matthew W Such
*Assistant Examiner* — David Spalla
(74) *Attorney, Agent, or Firm* — Eric J. Robinson; Robinson Intellectual Property Law Office, P.C.

(57) ABSTRACT

With a combination of a transistor including an oxide semiconductor material and a transistor including a semiconductor material other than an oxide semiconductor, a semiconductor device with a novel structure in which data can be retained for a long time and does not have a limitation on the number of writing can be obtained. When a connection electrode for connecting the transistor including a semiconductor material other than an oxide semiconductor to the transistor including an oxide semiconductor material is smaller than an electrode of the transistor including a semiconductor material other than an oxide semiconductor that is connected to the connection electrode, the semiconductor device with a novel structure can be highly integrated and the storage capacity per unit area can be increased.

21 Claims, 11 Drawing Sheets

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,846,826 B2 | 12/2010 | Oyu et al. | |
| 2001/0046027 A1 | 11/2001 | Tai et al. | |
| 2002/0030214 A1 | 3/2002 | Horiguchi | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0084255 A1 | 4/2006 | Oyu et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256237 A1 | 10/2009 | Kobayashi | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0187410 A1* | 8/2011 | Kato et al. | 326/46 |
| 2011/0198593 A1* | 8/2011 | Kato et al. | 257/57 |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-094027 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-634.

Prins.M et al., "A Ferroelectric Transparent Thin-Film Transistor,", Appl. Phys. Lett. (Applied Physics Ltters) , Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m(m = 7, 8, 9, and 16) in the In2O3—ZnGa2O4—ZnO System,", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N. et al., "SPINEL,YBFE2O4, and YB2FE3O7 Types of Structures for Compounds in the In2O3 and SC2O3—A2O3—BO Systems [A; Fe, Ga, or Al; B: Mg, Fe, Ni, Cu,or Zn] at Temperatures Over 1000° C.,", Journal of Soild State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1045501-4.

Park.J et al., "Dry etching of ZnO films and plasma-induced damage to optical properties,", J. Vac. Sci. Technol. B. (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Nomura.K et al., "Thin-Film Transistor Fabricated in Single-Crystalline Transparent Oxide Semiconductor,", Science, May 23, 2003, vol. 300, No. 5623, pp. 1269-1272.

Kim.K, "Technology for sub-50nm DRAM and NAND Flash Manufacturing,", IEDM 05: Technical Digest of International Electron Devices Meeting, Dec. 5, 2005, pp. 333-336.

\* cited by examiner

SEMICONDUCTOR DEVICE

BACKGROUND OF THE INVENTION

1. Field of the Invention

The disclosed invention relates to semiconductor devices including semiconductor elements and methods for manufacturing the semiconductor devices.

2. Description of the Related Art

Storage devices including semiconductor elements are broadly classified into two categories: volatile storage devices that lose stored data when power is not supplied and nonvolatile storage devices that retain stored data even when power is not supplied.

A typical example of a volatile storage device is a dynamic random access memory (a DRAM). A DRAM stores data in such a manner that a transistor included in a storage element is selected and electric charge is accumulated in a capacitor.

When data is read from a DRAM, electric charge in a capacitor is lost according to the principle; thus, another writing operation is necessary every time data is read. Further, a transistor included in a storage element has leakage current (off-state current) or the like between a source and a drain in an off state and electric charge flows into or out even if the transistor is not selected, so that a data retention period is short. For that reason, another writing operation (refresh operation) is necessary at predetermined intervals, and it is difficult to sufficiently reduce power consumption. Furthermore, since stored data is lost when power is not supplied, a different storage device including a magnetic material or an optical material is needed in order to retain data for a long time.

A different example of a volatile storage device is a static random access memory (an SRAM). An SRAM retains stored data by using a circuit such as a flip-flop and thus does not need refresh operation, which is an advantage over a DRAM. However, cost per storage capacity is high because a circuit such as a flip-flop is used. Further, as in a DRAM, stored data in an SRAM is lost when power is not supplied.

A typical example of a nonvolatile storage device is a flash memory. A flash memory includes a floating gate between a gate electrode and a channel formation region of a transistor and stores data by holding electric charge in the floating gate. Thus, a flash memory has advantages in that a data retention period is extremely long (semi-permanent) and refresh operation which is necessary in a volatile storage device is not needed (for example, see Patent Document 1).

However, there is a problem in that a storage element does not function after a predetermined number of writing operations because a gate insulating layer included in the storage element is degraded by tunneling current generated in writing operations. In order to reduce adverse effects of this problem, a method for equalizing the number of writing operations among storage elements is employed, for example. However, this method needs a complex peripheral circuit. Further, even when such a method is employed, fundamental life problems cannot be solved. That is, a flash memory is not suitable for applications in which data is frequently rewritten.

In addition, high voltage is necessary in order to inject electric charge in a floating gate or to remove the electric charge, and a circuit for generating high voltage is required. Further, it takes a comparatively long time to inject or remove electric charge, and it is not easy to increase the speed of writing or erasing data.

REFERENCE

Patent Document 1: Japanese Published Patent Application No. 57-105889.

SUMMARY OF THE INVENTION

In view of the problems, it is an object of one embodiment of the disclosed invention to provide a semiconductor device with a novel structure in which stored data can be retained even when power is not supplied, and does not have a limitation on the number of writing.

It is an object of one embodiment of the disclosed invention to provide a highly integrated semiconductor device with a novel structure and to increase storage capacity per unit area.

It is an object to suppress a short channel effect in a highly integrated semiconductor device with a novel structure.

One embodiment of the disclosed invention is a semiconductor device that includes a first transistor and a second transistor. The first transistor includes a first channel formation region provided in a substrate containing a semiconductor material, a first gate insulating layer provided over the first channel formation region, a first gate electrode that overlaps with the first channel formation region and is provided over the first gate insulating layer, and a first source region and a first drain region that are provided in the substrate containing a semiconductor material to sandwich the first channel formation region. The second transistor includes a first connection electrode provided on and in contact with the first gate electrode, a second connection electrode provided on and in contact with one of the first source region and the first drain region, a third connection electrode provided on and in contact with the second connection electrode, an insulating layer provided over the first transistor so that a top surface of the first connection electrode and a top surface of the third connection electrode are exposed, an oxide semiconductor layer provided over the insulating layer to partly overlap with at least the first source region or the first drain region, one of a second source electrode and a second drain electrode that is electrically connected to the oxide semiconductor layer and is provided in contact with the top surface of the first connection electrode, the other of the second source electrode and the second drain electrode that is electrically connected to the oxide semiconductor layer and is provided in contact with the top surface of the third connection electrode, a second gate electrode overlapping with the oxide semiconductor layer, and a second gate insulating layer provided between the oxide semiconductor layer and the second gate electrode. The length of the first connection electrode in a channel width direction of the first transistor is shorter than the length of the first gate electrode in the channel width direction of the first transistor.

Another embodiment of the disclosed invention is a semiconductor device that includes a first transistor and a second transistor. The first transistor includes a first channel formation region provided in a substrate containing a semiconductor material, a first gate insulating layer provided over the first channel formation region, a first gate electrode that overlaps with the first channel formation region and is provided over the first gate insulating layer, and a first source region and a first drain region that are provided in the substrate containing a semiconductor material to sandwich the first channel formation region. The second transistor includes a first connection electrode provided on and in contact with the first gate electrode, a second connection electrode provided on and in contact with one of the first source region and the first drain region, a third connection electrode provided on and in contact with the second connection electrode, an insulating layer provided over the first transistor so that a top surface of the first connection electrode and a top surface of the third connection electrode are exposed, an oxide semiconductor layer provided over the insulating layer to partly overlap with at least the first source region or the first drain region, one of a second source electrode and a second drain electrode that is electrically connected to the oxide semiconductor layer and is provided in contact with the top surface of the first connection electrode, the other of the second source electrode and the second drain electrode that is electrically connected to the oxide semiconductor layer and is provided in contact with the top surface of the third connection electrode, a second gate electrode overlapping with the oxide semiconductor layer, and a second gate insulating layer provided between the oxide semiconductor layer and the second gate electrode. The length of the third connection electrode in a channel length direction of the first transistor is shorter than the length of the second connection electrode in the channel length direction of the first transistor.

Another embodiment of the disclosed invention is a semiconductor device that includes a first transistor, a second transistor, a second trench, and an embedded insulating layer. The first transistor includes a first channel formation region provided in a substrate containing a semiconductor material, a first gate insulating layer provided over the first channel formation region, a first gate electrode that overlaps with the first channel formation region and is provided over the first gate insulating layer, and a first source region and a first drain region that are provided in the substrate containing a semiconductor material to sandwich the first channel formation region. The second transistor includes a first connection electrode provided on and in contact with the first gate electrode, a second connection electrode provided on and in contact with one of the first source region and the first drain region, a third connection electrode provided on and in contact with the second connection electrode, an insulating layer provided over the first transistor so that a top surface of the first connection electrode and a top surface of the third connection electrode are exposed, a first trench provided over the insulating layer, an oxide semiconductor layer provided to partly overlap with at least the first source region or the first drain region and to be in contact with a bottom surface and an inner wall surface of the first trench, one of a second source electrode and a second drain electrode that is electrically connected to the oxide semiconductor layer and the first connection electrode, the other of the second source electrode and the second drain electrode that is electrically connected to the oxide semiconductor layer and the third connection electrode, a second gate electrode that overlaps with the oxide semiconductor layer and is provided to fill the first trench, and a second gate insulating layer provided between the oxide semiconductor layer and the second gate electrode. The second trench is provided over the insulating layer to surround the second transistor and is deeper than the first trench. The embedded insulating layer is provided to fill the second trench. The length of the first connection electrode in a channel width direction of the first transistor is shorter than the length of the first gate electrode in the channel width direction of the first transistor.

Another embodiment of the disclosed invention is a semiconductor device that includes a first transistor, a second transistor, a second trench, and an embedded insulating layer. The first transistor includes a first channel formation region provided in a substrate containing a semiconductor material, a first gate insulating layer provided over the first channel formation region, a first gate electrode that overlaps with the first channel formation region and is provided over the first gate insulating layer, and a first source region and a first drain region that are provided in the substrate containing a semiconductor material to sandwich the first channel formation region. The second transistor includes a first connection electrode provided on and in contact with the first gate electrode, a second connection electrode provided on and in contact with one of the first source region and the first drain region, a third connection electrode provided on and in contact with the second connection electrode, an insulating layer provided over the first transistor so that a top surface of the first connection electrode and a top surface of the third connection electrode are exposed, a first trench provided over the insulating layer, an oxide semiconductor layer provided to partly overlap with at least the first source region or the first drain region and to be in contact with a bottom surface and an inner wall surface of the first trench, one of a second source electrode and a second drain electrode that is electrically connected to the oxide semiconductor layer and the first connection electrode, the other of the second source electrode and the second drain electrode that is electrically connected to the oxide semiconductor layer and the third connection electrode, a second gate electrode that overlaps with the oxide semiconductor layer and is provided to fill the first trench, and a second gate insulating layer provided between the oxide semiconductor layer and the second gate electrode. The second trench is provided over the insulating layer to surround the second transistor and is deeper than the first trench. The embedded insulating layer is provided to fill the second trench. The length of the third connection electrode in a channel length direction of the first transistor is shorter than the length of the second connection electrode in the channel length direction of the first transistor.

Note that in the above semiconductor device, part of the oxide semiconductor layer preferably overlaps with the second connection electrode. Further, it is preferable that the length of the third connection electrode in the channel width direction of the first transistor be substantially equal to the length of the first connection electrode in the channel width direction of the first transistor.

The insulating layer is preferably a stack of a first insulating layer and a second insulating layer. The first insulating layer is preferably formed on the same layer as the first gate electrode and the second connection electrode. The second insulating layer is preferably formed on the same layer as the first connection electrode and the third connection electrode. The proportion of oxygen in the second insulating layer is preferably higher than the proportion of oxygen in the first insulating layer.

A capacitor is preferably constituted by one of the second source electrode and the second drain electrode, the second gate insulating layer, and a conductive layer.

Another embodiment of the disclosed invention is a semiconductor device that includes the semiconductor devices. In the other of the second source electrode and the second drain electrode, the semiconductor devices are electrically connected to a wiring provided over the second transistor in parallel.

The first channel formation region preferably includes silicon. Further, the oxide semiconductor layer preferably includes an oxide semiconductor material containing In, Ga, and Zn.

Note that although the transistor is formed using an oxide semiconductor in the above semiconductor device in some cases, the disclosed invention is not limited thereto. A material which can have off-state current characteristics equivalent to those of the oxide semiconductor, for example, a wide-gap material such as silicon carbide (specifically, for example, a semiconductor material whose energy gap $E_g$ is more than 3 eV) may be used.

In this specification and the like, the expression "substantially equal" does not necessarily mean being exactly equal. For example, the expression "substantially equal" includes the degree of equality in a shape obtained by etching of a plurality of layers with one mask.

In this specification and the like, the term "channel length direction" means a direction from a source region (or a source electrode) toward a drain region (or a drain electrode) or the opposite direction, along the shortest path between the source region and the drain region. Further, in this specification and the like, the term "channel width direction" means a direction which is substantially perpendicular to the channel length direction.

Note that in this specification and the like, the term "over" or "below" does not necessarily mean that a component is placed "directly on" or "directly under" another component. For example, the expression "a gate electrode over a gate insulating layer" does not exclude the case where another component is placed between the gate insulating layer and the gate electrode.

In addition, in this specification and the like, the term "electrode" or "wiring" does not limit the function of a component. For example, an "electrode" can be used as part of a "wiring", and the "wiring" can be used as part of the "electrode". The term "electrode" or "wiring" can also mean a combination of a plurality of "electrodes" or "wirings", for example.

Note that a "source electrode", a "drain electrode", and a "gate electrode" may be simply referred to as a "source", a "drain", and a "gate", respectively. The functions of a "source" and a "drain" might interchange when a transistor of opposite polarity is used or the direction of current flow is changed in circuit operation, for example. Thus, in this specification, the terms "source" and "drain" can interchange.

Note that in this specification and the like, the expression "electrically connected" includes the case where components are connected to each other through an object having any electric action. Here, there is no particular limitation on an object having any electric action as long as electric signals can be transmitted and received between components that are connected to each other. Examples of an "object having any electric action" include an electrode, a wiring, a switching element such as a transistor, a resistor, an inductor, a capacitor, and an element with a variety of functions.

In one embodiment of the disclosed invention, a semiconductor device is formed using a material which can sufficiently reduce off-state current of a transistor, for example, an oxide semiconductor material that is a wide-gap semiconductor. With the use of a semiconductor material which can sufficiently reduce off-state current of a transistor, data can be retained for a long time.

In one embodiment of the disclosed invention, data is written by switching of on and off of a transistor including an oxide semiconductor material. Thus, it is possible to remove limitations on the number of writing because data writing does not need high voltage and elements are not degraded.

In one embodiment of the disclosed invention, a transistor including an oxide semiconductor material is used in combination with a transistor including a semiconductor material other than an oxide semiconductor. Thus, a semiconductor device having a novel feature can be obtained.

In one embodiment of the disclosed invention, a connection electrode for connecting a transistor including a semiconductor material other than an oxide semiconductor to a transistor including an oxide semiconductor material is made smaller than an electrode of the transistor including a semiconductor material other than an oxide semiconductor that is connected to the connection electrode. Thus, the area of the transistor including an oxide semiconductor material that is connected to the connection electrode can be decreased, so that a semiconductor device with a novel structure can be highly integrated and storage capacity per unit area can be increased.

In one embodiment of the disclosed invention, an oxide semiconductor layer of a transistor including an oxide semiconductor material is provided to be in contact with a bottom surface and an inner wall surface of a trench formed in an insulating layer. Thus, the channel length of the transistor can be made longer as compared to the case where the oxide semiconductor layer is formed on a plane, so that a short channel effect can be suppressed.

DETAILED DESCRIPTION OF THE INVENTION

Figure 1A:
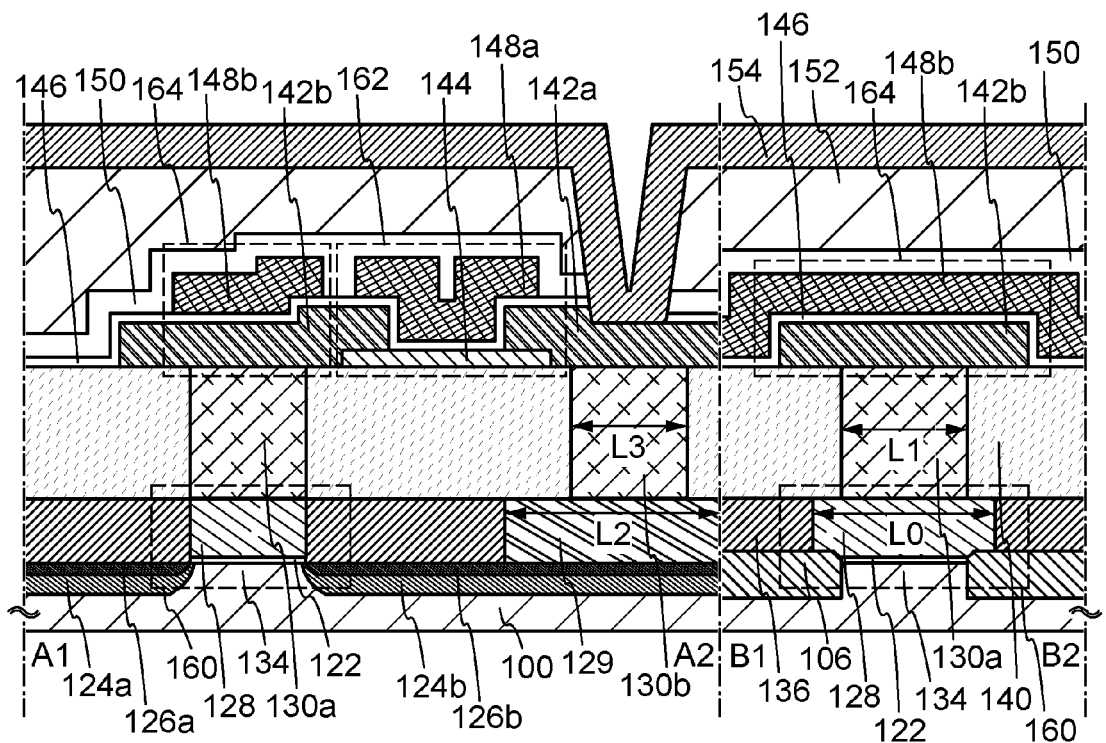
FIGS. 1A and 1B are a cross-sectional view and a plan view of a semiconductor device.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

Embodiment 1

In this embodiment, the structure of a semiconductor device according to one embodiment of the present invention is described with reference to FIGS. 1A and 1B and FIGS. 2A to 2D.

<Cross-Sectional Structure and Plan View of Semiconductor Device>

Figure 1B:
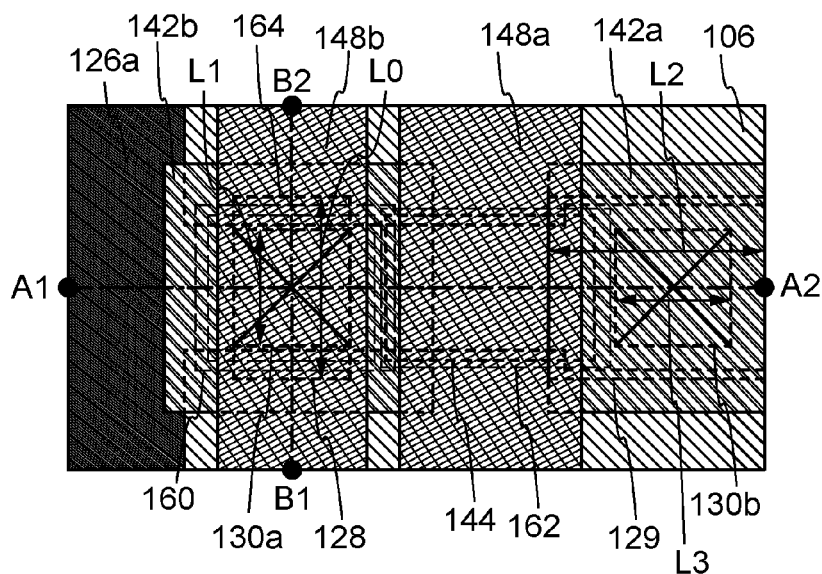

FIGS. 1A and 1B illustrate a structure example of a semiconductor device. FIG. 1A is a cross-sectional view of the semiconductor device, and FIG. 1B is a plan view of the semiconductor device. Line A1-A2 in FIG. 1A corresponds to line A1-A2 in FIG. 1B, and a cross-sectional view taken along line A1-A2 in FIG. 1A illustrates the semiconductor device in a direction parallel to a channel length direction of a transistor. Further, line B1-B2 in FIG. 1A corresponds to line B1-B2 in FIG. 1B, and a cross-sectional view taken along line B1-B2 in FIG. 1A illustrates the semiconductor device in a direction perpendicular to the channel length direction of the transistor. The semiconductor device in FIGS. 1A and 1B includes a transistor 160 including a first semiconductor material in a lower portion and a transistor 162 including a second semiconductor material in an upper portion. The semiconductor device in FIGS. 1A and 1B includes one transistor 160, one transistor 162, and one capacitor 164; however, the semiconductor device may include a plurality of transistors 160, a plurality of transistors 162, and a plurality of capacitors 164.

Here, the first semiconductor material and the second semiconductor material are preferably different from each other. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystalline. Alternatively, an organic semiconductor material or the like may be used. A transistor including such a semiconductor material can operate at high speed easily. On the other hand, a transistor including an oxide semiconductor can hold electric charge for a long time because of its characteristics.

Note that either an n-channel transistor or a p-channel transistor can be used as the transistor 160 and the transistor 162. Here, the case in which the transistor 162 is an n-channel transistor is described.

The transistor 160 includes a channel formation region 134 provided in a semiconductor substrate 100, impurity regions 124a and 124b (also referred to as a source region and a drain region) provided in the semiconductor substrate 100 to sandwich the channel formation region 134, metal compound regions 126a and 126b that are in contact with the impurity regions 124a and 124b, a gate insulating layer 122 provided over the channel formation region 134, and a gate electrode 128 that overlaps with the channel formation region 134 and is provided over the gate insulating layer 122. Note that the metal compound region 126a can function as the source region (or the drain region) of the transistor 160, so that the impurity region 124a and the metal compound region 126a might be collectively referred to as the drain region (or the source region). Further, the metal compound region 126b can function as the source region or the drain region of the transistor 160, so that the impurity region 124b and the metal compound region 126b might be collectively referred to as the source region or the drain region. A transistor whose source electrode and drain electrode are not explicitly illustrated in a drawing might be referred to as a transistor for convenience. Further, in such a case, in description of the connection of a transistor, a source region and a source electrode might be collectively referred to as a "source electrode," and a drain region and a drain electrode might be collectively referred to as a "drain electrode". That is, in this specification, the term "source electrode" might include a source region and the term "drain electrode" might include a drain region.

A connection electrode 130a is provided on and in contact with the gate electrode 128. Here, the connection electrode 130a also functions as a gate electrode of the transistor 160. Further, a connection electrode 129 is provided on and in contact with the metal compound region 126b (the drain region (or the source region) of the transistor 160) provided in the semiconductor substrate 100. Furthermore, a connection electrode 130b is provided on and in contact with the connection electrode 129. Here, the connection electrodes 129 and 130b also function as a source electrode and a drain electrode of the transistor 160.

Element isolation insulating layers 106 are formed on the semiconductor substrate 100 to surround the transistor 160. Insulating layers 136 and 140 are stacked on the transistor 160 so that top surfaces of the connection electrodes 130a and 130b are exposed. Here, the insulating layer 136 is preferably formed on the same layer as the gate electrode 128 and the connection electrode 129, and the insulating layer 140 is preferably formed on the same layer as the connection electrodes 130a and 130b. Note that the structure of the insulating layer for covering the transistor 160 is not necessarily a layered structure, and the insulating layer for covering the transistor 160 may have a single-layer structure. Alternatively, the insulating layer for covering the transistor 160 may have a layered structure of two or more layers.

Note that in order to achieve high integration, it is preferable that the transistor 160 does not have a sidewall insulating layer, as illustrated in FIGS. 1A and 1B. On the other hand, in the case where the characteristics of the transistor 160 have priority, a sidewall insulating layer may be provided on a side surface of the gate electrode 128, and the impurity regions 124a and 124b may include a region with a different impurity concentration provided in a region overlapping with the sidewall insulating layer.

The transistor 162 includes an oxide semiconductor layer 144 provided over the insulating layer 140; a source electrode (or a drain electrode) 142a and a drain electrode (or a source electrode) 142b that are electrically connected to the oxide semiconductor layer 144; a gate insulating layer 146 for covering the oxide semiconductor layer 144, the source electrode 142a, and the drain electrode 142b; and a gate electrode 148a provided over the gate insulating layer 146 to overlap with the oxide semiconductor layer 144. Here, the drain electrode 142b of the transistor 162 is provided on and in contact with the connection electrode 130a of the transistor 160. Accordingly, the potential of the gate electrode 128 of the transistor 160 can be held for an extremely long time taking advantage of the electric charge retention characteristics of the transistor 162. The source electrode 142a of the transistor 162 is provided on and in contact with the connection electrode 130b. The oxide semiconductor layer 144 functions as a channel formation region of the transistor 162 and is provided to partly overlap with at least the source region or the drain region of the transistor 160. The drain electrode 142b may be provided to be electrically connected to the connection electrode 130a with the oxide semiconductor layer 144 provided therebetween. Similarly, the source electrode 142a may be provided to be electrically connected to the connection electrode 130b with the oxide semiconductor layer 144 provided therebetween.

Here, the oxide semiconductor layer 144 included in the transistor 162 is preferably highly purified by sufficient removal of impurities such as hydrogen or sufficient supply of oxygen. Specifically, the hydrogen concentration in the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower, for example. Note that the hydrogen concentration in the oxide semiconductor layer 144 is measured by secondary ion mass spectrometry (SIMS). The oxide semiconductor layer 144 which is highly purified by a sufficient reduction in the hydrogen concentration and is reduced in defect level in an energy gap due to oxygen deficiency by sufficient supply of oxygen has a carrier concentration of lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per unit channel width (1 μm)) at room temperature (25° C.) is 100 zA (1 zA (zeptoampere) is $1 \times 10^{-21}$ A) or lower, preferably 10 zA or lower. In this manner, with the use of the oxide semiconductor layer 144 which is made to be intrinsic (i-type) or substantially intrinsic, the transistor 162 which has extremely excellent off-state current characteristics can be obtained.

The sodium concentration in the oxide semiconductor layer 144 is $5 \times 10^{16}$ atoms/cm$^3$ or lower, preferably $1 \times 10^{16}$ atoms/cm$^3$ or lower, more preferably $1 \times 10^{15}$ atoms/cm$^3$ or lower. The lithium concentration in the oxide semiconductor layer 144 is $5 \times 10^{15}$ atoms/cm$^3$ or lower, preferably $1 \times 10^{15}$ atoms/cm$^3$ or lower. The potassium concentration in the oxide semiconductor layer 144 is $5 \times 10^{15}$ atoms/cm$^3$ or lower, preferably $1 \times 10^{15}$ atoms/cm$^3$ or lower. Note that the sodium concentration, the lithium concentration, and the potassium concentration in the oxide semiconductor layer 144 are measured by secondary ion mass spectrometry. An alkali metal and an alkaline earth metal are adverse impurities for an oxide semiconductor and are preferably contained as little as possible. An alkali metal, especially, sodium diffuses into an oxide and becomes Na$^+$ when an insulating film that is in contact with the oxide semiconductor is the oxide. In addition, sodium cuts a bond between metal and oxygen or enters the bond in the oxide semiconductor. Consequently, transistor characteristics are degraded (for example, the transistor becomes normally on (a negative shift in the threshold voltage of the transistor) or the mobility is decreased). Further, this also causes a variation in characteristics. Such a problem is significant especially in the case where the hydrogen concentration in the oxide semiconductor is extremely low. Thus, the concentration of an alkali metal is strongly required to be the above value in the case where the hydrogen concentration in the oxide semiconductor is $5 \times 10^{19}$ atoms/cm$^3$ or lower, particularly $5 \times 10^{18}$ atoms/cm$^3$ or lower.

Note that the oxide semiconductor layer 144 may be either amorphous or crystalline. The crystalline oxide semiconductor layer is preferably composed of a crystalline oxide semiconductor film having c-axis alignment (also referred to as a c-axis aligned crystalline oxide semiconductor film (a CAAC-OS film)) because the reliability of the transistor can be improved.

Specifically, a CAAC-OS film is non-single-crystal and has a triangular, hexagonal, regular triangular, or regular hexagonal atomic order when seen from a direction perpendicular to an a-b plane. The CAAC-OS film also has a phase in which metal atoms are arranged in a layered manner in the c-axis direction or a phase in which metal atoms and oxygen atoms are arranged in a layered manner in the c-axis direction.

The CAAC-OS film is not a single crystal, but this does not mean that the CAAC-OS film is composed of only an amorphous component. Although the CAAC-OS film includes a crystallized portion (a crystalline portion), a boundary between one crystalline portion and another crystalline portion is not clear in some cases.

Nitrogen may be substituted for part of oxygen included in the CAAC-OS film. The c-axes of crystalline portions included in the CAAC-OS film may be aligned in one direction (e.g., a direction perpendicular to a surface of a substrate over which the CAAC-OS film is formed, a surface of the CAAC-OS film, an interface of the CAAC-OS film, or the like). Alternatively, normals of the a-b planes of the crystalline portions included in the CAAC-OS film may be aligned in one direction (e.g., the direction perpendicular to the surface of the substrate over which the CAAC-OS film is formed, the surface of the CAAC-OS film, the interface of the CAAC-OS film, or the like).

In the CAAC-OS film, metal atoms and oxygen atoms are bonded in an orderly manner in comparison with an amorphous oxide semiconductor film. In other words, in the case where an oxide semiconductor film is amorphous, the coordination number of oxygen atoms in a metal atom might vary between metal atoms, but the coordination number of metal atoms in a metal atom is substantially constant in the CAAC-OS film. Thus, microscopic defects of oxygen can be reduced and instability and electric charge transfer due to attachment and detachment of hydrogen atoms (including hydrogen ions) or alkali metal atoms can be reduced.

Consequently, when a transistor is formed using a CAAC-OS film, the amount of change in the threshold voltage of the transistor that occurs after light irradiation and a bias-temperature (BT) stress test are performed on the transistor can be reduced. Accordingly, a transistor with stable electrical characteristics can be formed.

Note that although the oxide semiconductor layer 144 which is processed into an island shape is used in the transistor 162 in order to reduce leakage current generated between elements due to miniaturization, the oxide semiconductor layer 144 which is not processed into an island shape may be used. In the case where the oxide semiconductor layer 144 is not processed into an island shape, contamination of the oxide semiconductor layer 144 due to etching in the processing can be prevented.

The capacitor 164 includes the drain electrode 142b, the gate insulating layer 146, and a conductive layer 148b. Specifically, the drain electrode 142b functions as one electrode of the capacitor 164, and the conductive layer 148b functions as the other electrode of the capacitor 164. With such a structure, capacitance can be sufficiently secured. Further, insulation between the drain electrode 142b and the conductive layer 148b can be sufficiently secured in the case where the oxide semiconductor layer 144 and the gate insulating layer 146 are stacked. In the case where a capacitor is not needed, it is possible not to provide the capacitor 164.

Insulating layers 150 and 152 are provided over the transistor 162 and the capacitor 164. A wiring 154 is provided over the insulating layers 150 and 152 and is connected to the source electrode 142a through an opening formed in the gate insulating layer 146, the insulating layers 150 and 152, and the like. Here, the wiring 154 is preferably provided to partly overlap with at least the oxide semiconductor layer 144 of the transistor 162. In addition, an insulating layer may be provided over the wiring 154.

Here, in FIGS. 1A and 1B, the transistors 160 and 162 are provided to at least partly overlap with each other, and the source region or the drain region of the transistor 160 is provided to partly overlap with the oxide semiconductor layer 144. The wiring 154 is provided to partly overlap with at least the oxide semiconductor layer 144. The transistor 162 and the capacitor 164 are provided to overlap with the transistor 160. For example, the conductive layer 148b of the capacitor 164 is provided to partly overlap with at least the gate electrode 128 of the transistor 160. With such a planar layout, the area of the semiconductor device can be decreased.

However, it cannot be said that the area is sufficiently decreased only by the overlap of the transistors 160 and 162. This is because in portions (the source electrode 142a and the drain electrode 142b) of the transistor 162 that are in contact with the transistor 160, it is necessary to provide a margin for portions of the transistor 160 that are in contact with the transistor 162. In other words, in order to sufficiently decrease the area of the semiconductor device, it is necessary to sufficiently decrease the area of the portions of the transistor 162 that are in contact with the transistor 160.

Here, it is necessary that the area of the gate electrode 128 of the transistor 160 be larger than the area of a region of the semiconductor substrate 100 that is exposed from the element isolation insulating layers 106 so that the gate electrode 128 of the transistor 160 securely overlaps with the exposed region. Further, it is preferable to increase the area of the connection electrode 129 of the transistor 160 in order to reduce contact resistance with the metal compound region 126b. Thus, in the case where the gate electrode 128 of the transistor 160 and the connection electrode 129 are directly connected to the source electrode 142a and the drain electrode 142b of the transistor 162, it is necessary to provide the source electrode 142a and the drain electrode 142b by provision of an additional margin for the area of these electrodes. Accordingly, the area of the portions of the transistor 162 that are in contact with the transistor 160 is increased, so that a decrease in the area of the semiconductor device is inhibited.

Thus, in this embodiment, in order to further decrease the area of the semiconductor device, the area of the connection electrodes 130a and 130b that are electrically connected to the transistors 160 and 162 is made smaller than the area of the gate electrode 128 and the connection electrode 129. Specifically, the length of the connection electrode 130a in a channel width direction of the transistor 160 (the length is hereinafter indicated by $L_1$) is made shorter than the length of the gate electrode 128 in the channel width direction of the transistor 160 (the length is hereinafter indicated by $L_0$), and the length of the connection electrode 130b in a channel length direction of the transistor 160 (the length is hereinafter indicated by $L_3$) is made shorter than the length of the connection electrode 129 in the channel length direction of the transistor 160 (the length is hereinafter indicated by $L_2$). Here, the length in the channel width direction of the transistor 160 means length in an A1-A2 direction in FIG. 1B, and the length in the channel length direction of the transistor 160 means length in a B1-B2 direction in FIG. 1B.

Here, the length $L_1$ of the connection electrode 130a is preferably 0.5 times or more and less than 1 times the length $L_0$ of the gate electrode 128, and the minimum feature size (F) is preferably 1 F or more and less than 2 F, more preferably about 1 F. Further, the length $L_3$ of the connection electrode 130b is preferably 0.5 times or more and less than 1 times the length $L_2$ of the connection electrode 129, and the minimum feature size (F) is preferably 1 F or more and less than 2 F, more preferably about 1 F.

When such a structure is compared to the structure in which the gate electrode 128 of the transistor 160 and the connection electrode 129 are directly connected to the source electrode 142a and the drain electrode 142b of the transistor 162, in the planar shape of the portions of the transistor 162 that are in contact with the transistor 160, the length in the A1-A2 direction is decreased in response to a difference between $L_2$ and $L_3$ and the length in the B1-B2 direction is decreased in response to a difference between $L_0$ and $L_1$. Thus, the area of the semiconductor device can be further decreased. When a storage device including the semiconductor devices in this embodiment that are arrayed as memory cells is formed, the effect of decrease in area can be obtained in accordance with the number of memory cells. Thus, the storage device can be highly integrated effectively, and storage capacity per unit area can be increased.

As illustrated in FIGS. 1A and 1B, the connection electrode 129 is preferably provided to partly overlap with the oxide semiconductor layer 144, more preferably provided to extend in the A1-A2 direction. When the connection electrode 129 is provided in this manner, the contact resistance between the connection electrode 129 and the metal compound region 126b can be reduced without an increase in the area of the semiconductor device.

Further, as illustrated in FIG. 1B, it is preferable that the length of the connection electrode 130b in the channel width direction of the transistor 160 be substantially equal to the length $L_1$ of the connection electrode 130a. Thus, the length of the source electrode 142a in the direction can be substantially equal to the length of the drain electrode 142b in the direction.

Note that in the semiconductor device in FIGS. 1A and 1B, the length $L_1$ of the connection electrode 130a is shorter than the length $L_0$ of the gate electrode 128 and the length $L_3$ of the connection electrode 130b is shorter than the length $L_2$ of the connection electrode 129; however, the semiconductor device according to one embodiment of this embodiment is not limited thereto. Any structure can be used as long as at least one of the connection electrodes 130a and 130b satisfies the above condition. It is possible not to provide the connection electrode 129 and the connection electrode 130b.

Although a top-gate transistor is used as the transistor 162 in the semiconductor device in FIGS. 1A and 1B, the semiconductor device according to one embodiment of this embodiment is not limited thereto. For example, a bottom-gate transistor can be used as the transistor 162.

Although a transistor in which the source electrode 142a and the drain electrode 142b are in contact with at least a top surface of the oxide semiconductor layer 144 is used as the transistor 162 in the semiconductor device in FIGS. 1A and 1B, this embodiment is not limited thereto. For example, a transistor in which the oxide semiconductor layer 144 is in contact with at least top surfaces of the source electrode 142a and the drain electrode 142b may be used as the transistor 162.

<Circuit Structure of Semiconductor Device>

Next, circuit structures and operations of the semiconductor device in FIGS. 1A and 1B are described with reference to FIGS. 2A to 2D. Note that in circuit diagrams, "OS" is written beside a transistor in order to indicate that the transistor includes an oxide semiconductor.

<Basic Structure>

Figure 2A:
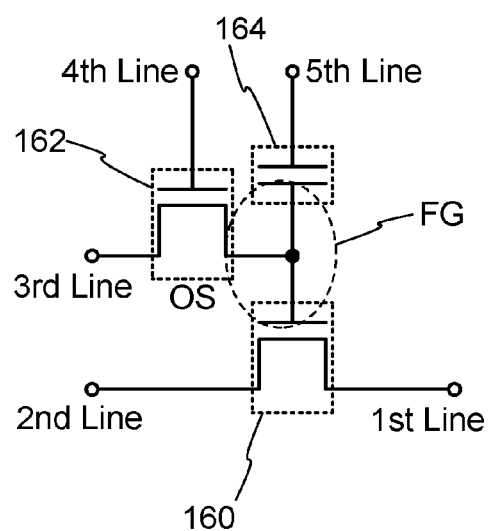
FIGS. 2A to 2D are circuit diagrams of a semiconductor device.

In the semiconductor device in FIG. 2A, a first wiring (1st Line) and the source electrode (or the drain electrode) of the transistor 160 are electrically connected to each other, and a second wiring (2nd Line) and the drain electrode (or the source electrode) of the transistor 160 are electrically connected to each other. A third wiring (3rd Line) and the source electrode (or the drain electrode) of the transistor 162 are electrically connected to each other, and a fourth wiring (4th Line) and the gate electrode of the transistor 162 are electrically connected to each other. The gate electrode of the transistor 160 and the drain electrode (or the source electrode) of the transistor 162 are electrically connected to one electrode of the capacitor 164, and a fifth wiring (5th Line) and the other electrode of the capacitor 164 are electrically connected to each other. In addition, the second wiring and the third wiring may be connected to each other, as illustrated in FIG. 2B.

Figure 2B:
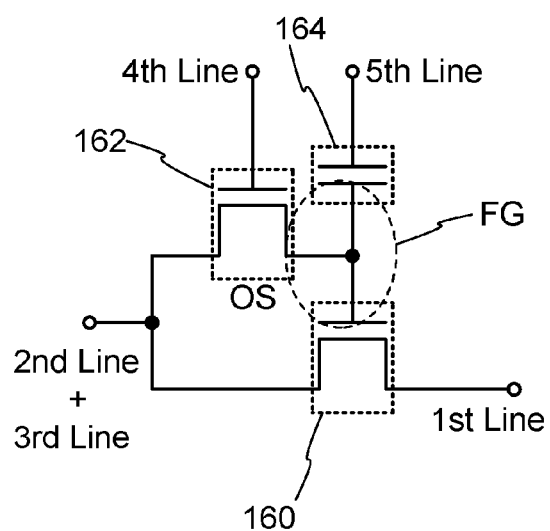

Note that the circuit structures in FIGS. 2A and 2B correspond to the circuit structures of the semiconductor device in FIGS. 1A and 1B. In other words, a wiring electrically connected to the source region (the impurity region 124a and the metal compound region 126a) of the transistor 160 in FIGS. 1A and 1B corresponds to the first wiring. A wiring electrically connected to the drain region (the impurity region 124b and the metal compound region 126b) of the transistor 160 in FIGS. 1A and 1B corresponds to the second wiring. A wiring (the wiring 154) electrically connected to the source electrode 142a of the transistor 162 in FIGS. 1A and 1B corresponds to the third wiring. A wiring electrically connected to the gate electrode 148a of the transistor 162 in FIGS. 1A and 1B corresponds to the fourth wiring. A wiring electrically connected to the conductive layer 148b in FIGS. 1A and 1B corresponds to the fifth wiring. Note that the positions of the first wiring and the second wiring may be reversed. In other words, the wiring electrically connected to the source region (the impurity region 124a and the metal compound region 126a) of the transistor 160 may correspond to the second wiring, and the wiring electrically connected to the drain region (the impurity region 124b and the metal compound region 126b) of the transistor 160 may correspond to the first wiring. Here, the circuit structure in FIG. 2A corresponds to a circuit structure in which the connection electrodes 129 and 130b are not provided and the source region (the impurity region 124a and the metal compound region 126a) of the transistor 160 is not electrically connected to the source electrode 142a of the transistor 162 in the semiconductor device in FIGS. 1A and 1B. Further, the circuit structure in FIG. 2B corresponds to a circuit structure in which the connection electrodes 129 and 130b are provided and the source region (the impurity region 124a and the metal compound region 126a) of the transistor 160 is electrically connected to the source electrode 142a of the transistor 162.

Here, the transistor including an oxide semiconductor is used as the transistor 162, for example. The off-state current of the transistor including an oxide semiconductor is extremely low. Thus, when the transistor 162 is turned off, the potential of the gate electrode of the transistor 160 can be held for an extremely long time. Provision of the capacitor 164 facilitates holding of electric charge given to the gate electrode of the transistor 160 and reading of stored data.

Note that there is no particular limitation on the material of the transistor 160. A transistor including a semiconductor material other than an oxide semiconductor is used, for example. In order to increase the speed of reading data, it is preferable to use, for example, a transistor with high switching speed, such as a transistor formed using single crystal silicon.

Figure 2C:
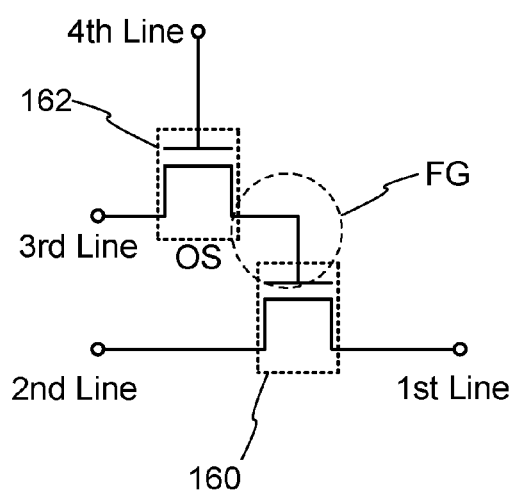

As illustrated in FIG. 2C, it is possible not to provide the capacitor 164 in FIG. 2A. Needless to say, it is possible not to provide the capacitor 164 in FIG. 2B.

The semiconductor device in FIG. 2A can write, retain, and read data as follows, utilizing a feature that the potential of the gate electrode of the transistor 160 can be held.

First, data writing and data retention are described. The potential of the fourth wiring is set to a potential at which the transistor 162 is turned on, so that the transistor 162 is turned on. Thus, the potential of the third wiring is applied to a node (also referred to as a node FG) where the drain electrode (or the source electrode) of the transistor 162, the gate electrode of the transistor 160, and one electrode of the capacitor 164 are electrically connected to each other. That is, predetermined electric charge is given to the gate electrode of the transistor 160 (data writing). Here, one of electric charges for supply of two different potentials (hereinafter, an electric charge for supply of a low potential and an electric charge for supply of a high potential are referred to as an electric charge $Q_L$ and an electric charge $Q_H$, respectively) is given to the gate electrode of the transistor 160. Note that electric charges giving three or more different potentials may be applied to improve storage capacity. After that, the potential of the fourth wiring is set to a potential at which the transistor 162 is turned off, so that the transistor 162 is turned off. Thus, the electric charge given to the gate electrode of the transistor 160 is held (data retention).

Since the off-state current of the transistor 162 is extremely low, the electric charge of the gate electrode of the transistor 160 is held for a long time.

Next, data reading is described. When an appropriate potential (a reading potential) is applied to the fifth wiring while a predetermined potential (a constant potential) is applied to the first wiring, the potential of the second wiring varies depending on the amount of electric charge held in the gate electrode of the transistor 160. In other words, the conductance of the transistor 160 is controlled by the electric charge held in the gate electrode of the transistor 160 (the node FG). This is generally because apparent threshold voltage $V_{th\_H}$ at the time when electric charge $Q_H$ is given to the gate electrode of the transistor 160 is lower than apparent threshold voltage $V_{th\_L}$ at the time when electric charge $Q_L$ is given to the gate electrode of the transistor 160. Here, the apparent threshold voltage is the potential of the fifth wiring that is needed to switch the transistor 160 from an off state to an on state or to switch the transistor 160 from an on state to an off state. Thus, the potential of the fifth wiring is set to a potential $V_0$ that is intermediate between $V_{th\_H}$ and $V_{th\_L}$, so that electric charge given to the gate electrode of the transistor 160 can be determined. For example, when the transistor 160 is an n-channel transistor, in the case where the electric charge $Q_H$ is given in writing, the transistor 160 is turned on when the potential of the fifth wiring is set to $V_0$ ($>V_{th\_H}$). In the case where the electric charge $Q_L$ is given, even when the potential of the fifth wiring is set to $V_0$ ($<V_{th\_L}$), the transistor 160 is kept off. Note that when the transistor 160 is a p-channel transistor, the transistor 160 is turned on in the case where the electric charge $Q_L$ is given, and the transistor 160 is kept off in the case where the electric charge $Q_H$ is given. Accordingly, stored data can be read when the potential of the second wiring is measured.

Note that in the case where memory cells are arrayed, it is necessary that data can be read only from a desired memory cell. In order to read data from a predetermined memory cell and not to read data from the other memory cells in this manner, in the case where the transistors 160 are connected in parallel between the memory cells, fifth wirings in memory cells from which data is not read are supplied with a potential at which the transistors 160 are turned off regardless of the states of the gate electrodes, that is, a potential that is lower than $V_{th\_H}$. In the case where the transistors 160 are connected in series between the memory cells, the fifth wirings in the memory cells from which data is not read are supplied with a potential at which the transistors 160 are turned on regardless of the states of the gate electrodes, that is, a potential that is higher than $V_{th\_L}$.

Next, data rewriting is described. Data rewriting is performed in a manner similar to those of the data writing and the data retention. In other words, the potential of the fourth wiring is set to a potential at which the transistor 162 is turned on, so that the transistor 162 is turned on. Thus, the potential of the third wiring (a potential related to new data) is applied to the gate electrode of the transistor 160 and the capacitor 164. After that, the potential of the fourth wiring is set to a potential at which the transistor 162 is turned off, so that the transistor 162 is turned off. Accordingly, electric charge related to the new data is given to the gate electrode of the transistor 160.

In the semiconductor device according to one embodiment of the disclosed invention, data can be directly rewritten by another data writing as described above. Thus, extraction of electric charge from a floating gate with high voltage needed in a flash memory or the like is not necessary, so that a decrease in operation speed due to erasing operation can be inhibited. That is, the semiconductor device can operate at high speed.

Note that the node (the node FG) where the drain electrode (or the source electrode) of the transistor 162, the gate electrode of the transistor 160, and one electrode of the capacitor 164 are electrically connected to each other has a function similar to that of a floating gate of a floating-gate transistor which is used as a nonvolatile memory element. When the transistor 162 is off, the node FG can be regarded as being embedded in an insulator and electric charge is held in the node FG. The off-state current of the transistor 162 including an oxide semiconductor is lower than or equal to one hundred thousandth of the off-state current of a transistor including a silicon semiconductor or the like; thus, loss of the electric charge accumulated in the node FG due to leakage of the transistor 162 is negligible. In other words, with the transistor 162 including an oxide semiconductor, a nonvolatile storage device which can retain data without supply of power can be obtained.

For example, when the off-state current of the transistor 162 is 10 zA (1 zA (zeptoampere) is $1 \times 10^{-21}$ A) or less at room temperature (25° C.) and the capacitance value of the capacitor 164 is approximately 10 fF, data can be retained for at least $10^4$ s or longer. Note that it is needless to say that the retention time depends on transistor characteristics and the capacitance value.

Further, in the semiconductor device according to one embodiment of the disclosed invention, the problem of degradation of a gate insulating film (a tunnel insulating film), which is pointed out in a conventional floating-gate transistor, does not exist. That is, the degradation of a gate insulating film due to injection of electrons into a floating gate, which is a conventional problem, can be solved. This means that there is no limitation on the number of writing, in principle. Further, high voltage needed for writing or erasing in a conventional floating-gate transistor is not necessary.

Figure 2D:
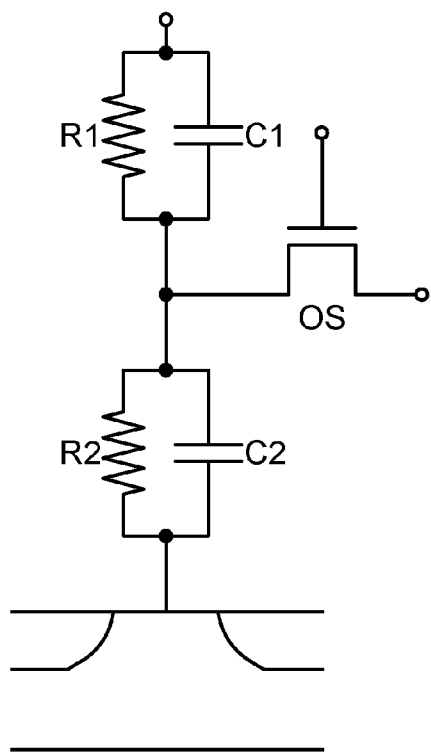

Components such as transistors in the semiconductor device in FIG. 2A can be regarded as including resistors and capacitors, as illustrated in FIG. 2D. That is, in FIG. 2D, the transistor 160 and the capacitor 164 are each regarded as including a resistor and a capacitor. $R_1$ and $C_1$ denote the resistance and the capacitance of the capacitor 164, respectively. The resistance $R_1$ corresponds to the resistance of an insulating layer included in the capacitor 164. $R_2$ and $C_2$ denote the resistance and the capacitance of the transistor 160, respectively. The resistance $R_2$ corresponds to the resistance of a gate insulating layer at the time when the transistor 160 is on. The capacitance $C_2$ corresponds to so-called gate capacitance (capacitance formed between the gate electrode and the source electrode or the drain electrode and capacitance formed between the gate electrode and the channel formation region).

An electric charge holding period (also referred to as a data retention period) depends mainly on the off-state current of the transistor 162 under the conditions that the gate leakage current of the transistor 162 is sufficiently low and that $R_1 \geq ROS$ and $R_2 \geq ROS$ are satisfied, where the resistance (also referred to as effective resistance) between the source electrode and the drain electrode at the time when the transistor 162 is off is denoted by ROS.

In contrast, when the conditions are not satisfied, it is difficult to sufficiently secure the holding period even if the off-state current of the transistor 162 is sufficiently low. This is because leakage current other than the off-state current of the transistor 162 (e.g., leakage current generated between the source electrode and the gate electrode) is high. Thus, it can be said that the semiconductor device disclosed in this embodiment preferably satisfies the above relation.

It is preferable that $C_1 \geq C_2$ be satisfied. This is because when $C_1$ is large, the potential of the fifth wiring can be efficiently applied to the node FG at the time of controlling the potential of the node FG by the fifth wiring, and a difference between potentials (e.g., the reading potential and a non-reading potential) applied to the fifth wiring can be reduced.

When the above relation is satisfied, a more favorable semiconductor device can be obtained. Note that $R_1$ and $R_2$ are controlled by the gate insulating layer of the transistor 160 and the insulating layer of the capacitor 164. The same relation is applied to $C_1$ and $C_2$. Thus, the material, the thickness, and the like of the gate insulating layer are preferably set as appropriate so that the above relation is satisfied.

In the semiconductor device in this embodiment, the node FG has a function similar to that of a floating gate of a floating-gate transistor in a flash memory or the like, but the node FG of this embodiment has a feature which is essentially different from the feature of a floating gate in a flash memory or the like. In the case of a flash memory, since voltage applied to a control gate is high, it is necessary to keep a proper distance between cells in order to prevent the potential from affecting a floating gate of an adjacent cell. This is one of the factors inhibiting high integration of the semiconductor device. The factor is due to the basic principle of a flash memory: tunneling current is generated by application of a high electric field.

In contrast, the semiconductor device in this embodiment is operated by switching of the transistor including an oxide semiconductor and does not use the principle of electric charge injection by tunneling current. That is, unlike a flash memory, a high electric field for electric charge injection is not necessary. Accordingly, it is not necessary to consider the influence of a high electric field from a control gate on an adjacent cell, which facilitates high integration.

In addition, the semiconductor device in this embodiment is advantageous over a flash memory also in that a high electric field is not necessary and that a large peripheral circuit (e.g., a step-up circuit (a step-up DC-DC converter)) is not necessary. For example, the highest voltage applied to the memory cell in this embodiment (the difference between the highest potential and the lowest potential applied to terminals of the memory cell at the same time) can be 5 V or lower, preferably 3 V or lower in one memory cell in the case where two levels (one bit) of data are written.

In the case where the relative dielectric constant $\in r1$ of the insulating layer included in the capacitor 164 is different from the relative dielectric constant $\in r2$ of the insulating layer included in the transistor 160, it is easy to satisfy $C_1 \geq C_2$ while $2 \times S_2 \geq S_1$ (preferably $S_2 \geq S_1$) is satisfied, where $S_1$ is the area of the insulating layer included in the capacitor 164 and $S_2$ is the area of the insulating layer forming gate capacitance in the transistor 160. That is, it is easy to satisfy $C_1 \geq C_2$ while the area of the insulating layer included in the capacitor 164 is made small. Specifically, for example, a film formed using a high-k material such as hafnium oxide or a stack of a film formed using a high-k material such as hafnium oxide and a film formed using an oxide semiconductor is used for the insulating layer included in the capacitor 164 so that $\in r1$ can be 10 or more, preferably 15 or more, and silicon oxide is used for the insulating layer forming gate capacitance so that $\in r2$ can be 3 to 4.

A combination of such structures enables higher integration of the semiconductor device according to one embodiment of the disclosed invention.

Note that the use of a value multiplexing technique can increase the storage capacity of the semiconductor device. For example, three or more levels of data are written to one memory cell, so that the storage capacity can be increased as compared to the case where two levels of data are written. Value multiplexing can be achieved by, for example, giving electric charge Q for applying a different potential to the gate electrode of the first transistor, in addition to the electric charge $Q_L$ for applying a low potential and the electric charge $Q_H$ for applying a high potential.

Note that although an n-channel transistor in which electrons are carriers is used in the above description, it is needless to say that a p-channel transistor in which holes are carriers can be used instead of the n-channel transistor.

As described above, in the semiconductor device in this embodiment, since the off-state current of the transistor including an oxide semiconductor is extremely low, stored data can be retained for an extremely long time with the use of the transistor. In other words, refresh operation is not needed or the frequency of the refresh operation can be extremely decreased, which leads to a sufficient reduction in power consumption. Further, stored data can be retained for a long time even when power is not supplied (a potential is preferably fixed).

Further, the semiconductor device in this embodiment does not need high voltage for data writing and does not have the problem of degradation of elements. For example, unlike a conventional nonvolatile memory, it is not necessary to inject and extract electrons into and from a floating gate; thus, the problem of degradation of a gate insulating layer does not occur. In other words, the semiconductor device in this embodiment does not have the limitation on the number of writing, which is a problem of a conventional nonvolatile memory, and reliability thereof is markedly improved. Furthermore, data is written depending on the on and off of the transistor, so that high-speed operation can be easily achieved.

Since a transistor including a material other than an oxide semiconductor can operate at sufficiently high speed, a semiconductor device can perform operation (e.g., data reading) at sufficiently high speed in combination with a transistor including an oxide semiconductor. Further, a transistor including a material other than an oxide semiconductor can favorably achieve a variety of circuits (e.g., a logic circuit or a driver circuit) which need to operate at high speed.

A semiconductor device having a novel feature can be obtained with provision of both a transistor including a material other than an oxide semiconductor (in a broader sense, a transistor capable of operating at sufficiently high speed) and a transistor including an oxide semiconductor (in a broader sense, a transistor whose off-state current is sufficiently low).

In the semiconductor device in this embodiment, a connection electrode for connecting the transistor including a semiconductor material other than an oxide semiconductor to the transistor including an oxide semiconductor material is made smaller than an electrode of the transistor including a semiconductor material other than an oxide semiconductor that is connected to the connection electrode. Thus, the area of the transistor including an oxide semiconductor material that is connected to the connection electrode can be decreased, so that a semiconductor device with a novel structure can be highly integrated and storage capacity per unit area can be increased.

As described above, the structures, methods, and the like described in this embodiment can be combined with any of the structures, methods, and the like described in the other embodiments as appropriate.

Embodiment 2

In this embodiment, a method for forming the semiconductor device described in the above embodiment with reference to FIGS. 1A and 1B is described with reference to FIGS. 3A to 3D, FIGS. 4A to 4C, FIGS. 5A to 5D, FIGS. 6A to 6C, FIGS. 7A and 7B, and FIGS. 8A and 8B.

<Method for Forming Transistor in Lower Portion>

A method for forming the transistor 160 in a lower portion is described with reference to FIGS. 3A to 3D, FIGS. 4A to 4C, and FIGS. 5A to 5D.

Figure 3A:
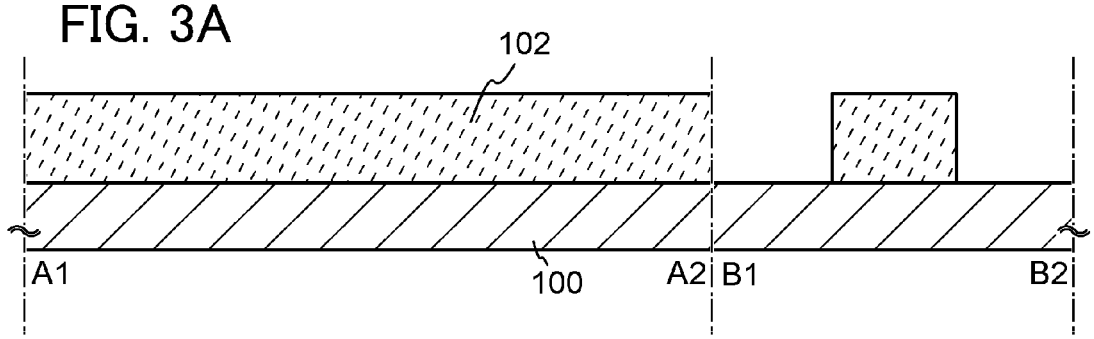
FIGS. 3A to 3D are cross-sectional views illustrating steps of forming a semiconductor device.
Figure 3B:
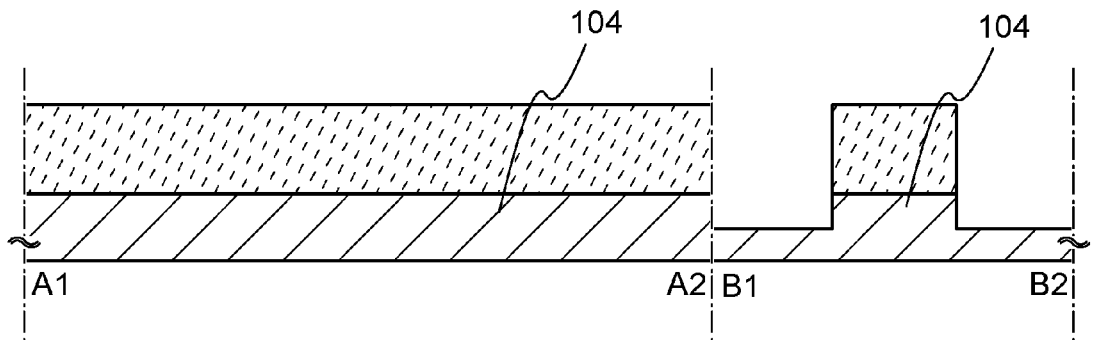

First, the semiconductor substrate 100 is prepared (see FIG. 3A). A single crystal semiconductor substrate or a polycrystalline semiconductor substrate of silicon, silicon carbide, or the like; a compound semiconductor substrate of silicon germanium or the like; an SOI substrate; or the like can be used as the semiconductor substrate 100. Here, an example in which a single crystal silicon substrate is used as the semiconductor substrate 100 is described. Note that although the term "SOI substrate" generally means a substrate where a silicon semiconductor layer is provided on an insulating surface, the term "SOI substrate" in this specification and the like also means a substrate where a semiconductor layer including a material other than silicon is provided on an insulating surface. That is, a semiconductor layer included in the "SOI substrate" is not limited to a silicon semiconductor layer. Further, the SOI substrate can be a substrate having a structure in which a semiconductor layer is provided over an insulating substrate such as a glass substrate with an insulating layer provided therebetween.

It is particularly preferable that a single crystal semiconductor substrate of silicon or the like be used as the semiconductor substrate 100 because the speed of reading operation of the semiconductor device can be increased.

A protective layer 102 serving as a mask for forming element isolation insulating layers is formed over the semiconductor substrate 100 (see FIG. 3A). For example, an insulating layer formed using a material such as silicon oxide, silicon nitride, silicon oxynitride, or silicon nitride oxide can be used as the protective layer 102. Note that silicon oxynitride contains more oxygen than nitrogen, and silicon nitride oxide contains more nitrogen than oxygen.

Note that before or after this step, an impurity element imparting n-type conductivity or an impurity element imparting p-type conductivity may be added to the semiconductor substrate 100 in order to control the threshold voltage of the transistor. When silicon is used as the semiconductor, phosphorus, arsenic, or the like can be used as the impurity element imparting n-type conductivity, for example. Boron, aluminum, gallium, or the like can be used as the impurity element imparting p-type conductivity, for example.

Next, part of the semiconductor substrate 100 in a region that is not covered with the protective layer 102 (i.e., an exposed region) is removed by etching using the protective layer 102 as a mask. Thus, a semiconductor region 104 separated from other semiconductor regions is formed (see FIG. 3B). As the etching, dry etching is preferably performed; however, wet etching may be performed. An etching gas and an etchant can be selected as appropriate depending on a material to be etched.

Figure 3C:
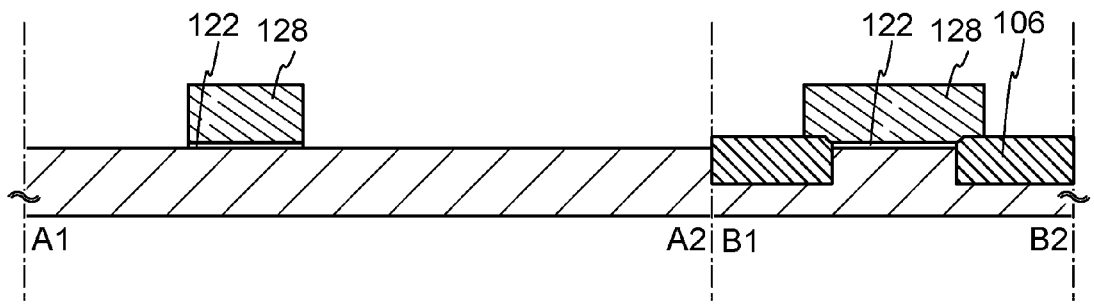

Then, an insulating layer is formed to cover the semiconductor region 104, and the insulating layer in a region overlapping with the semiconductor region 104 is selectively removed, so that the element isolation insulating layers 106 are formed (see FIG. 3C). The insulating layer is formed using silicon oxide, silicon nitride, silicon oxynitride, silicon nitride oxide, or the like. As a method for removing the insulating layer, any of polishing treatment such as chemical mechanical polishing (CMP), etching treatment, and the like can be used. Note that the protective layer 102 is removed after the semiconductor region 104 is formed or after the element isolation insulating layers 106 are formed.

Next, an insulating layer is formed over a surface of the semiconductor region 104, and a layer containing a conductive material is formed over the insulating layer.

The insulating layer is to be a gate insulating layer later and can be formed, for example, by performing heat treatment (e.g., thermal oxidation treatment or thermal nitriding treatment) on a surface of the semiconductor region 104. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by CVD, sputtering, or the like. The insulating layer preferably has a single-layer structure or a layered structure using a film including any of silicon oxide, silicon oxynitride, silicon nitride oxide, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The thickness of the insulating layer can be, for example, 1 to 100 nm, preferably 10 to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of deposition methods such as vapor deposition, CVD, sputtering, or spin coating can be used. Note that in this embodiment, an example in which the layer containing a conductive material is formed using a metal material is described.

Then, the insulating layer and the layer containing a conductive material are selectively etched, so that the gate insulating layer 122 and the gate electrode 128 are formed (see FIG. 3C). At this time, in order to make the gate electrode 128 securely overlap with a region of the semiconductor substrate 100 that is exposed from the element isolation insulating layers 106, it is necessary that the length of the gate electrode 128 in the B1-B2 direction be longer than the length of the region by provision of a margin.

Figure 3D:
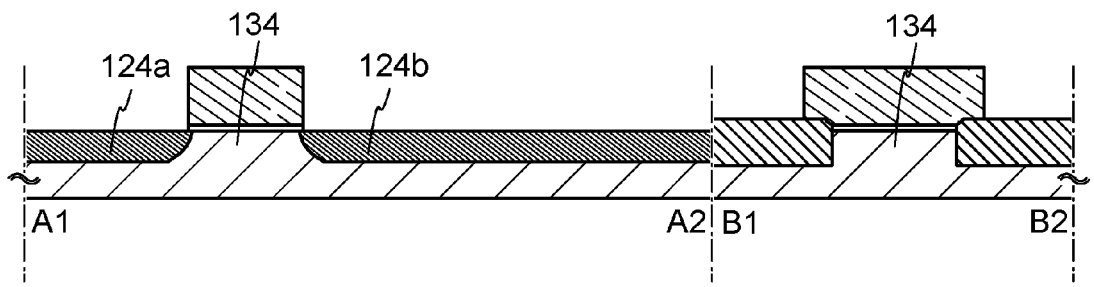

Next, phosphorus (P), arsenic (As), or the like is added to the semiconductor region 104, so that the channel formation region 134 and the impurity regions 124a and 124b are formed (see FIG. 3D). Although phosphorus or arsenic is added here in order to form an n-channel transistor, an impurity element such as boron (B) or aluminum (Al) may be added in the case where a p-channel transistor is formed. Here, the concentration of the impurity to be added can be set as appropriate; however, the concentration of the impurity is preferably increased in the case where a semiconductor element is highly miniaturized. Note that the channel formation region 134 and the impurity regions 124a and 124b are self-aligned to the gate electrode 128 in this manner. Thus, it is not necessary to provide a margin for the length of the gate electrode 128 in the A1-A2 direction, and the length of the gate electrode 128 in the A1-A2 direction can be set as appropriate.

Note that a sidewall insulating layer may be formed around the gate electrode 128 so that impurity regions to which impurity elements are added at different concentrations are formed.

Figure 4A:
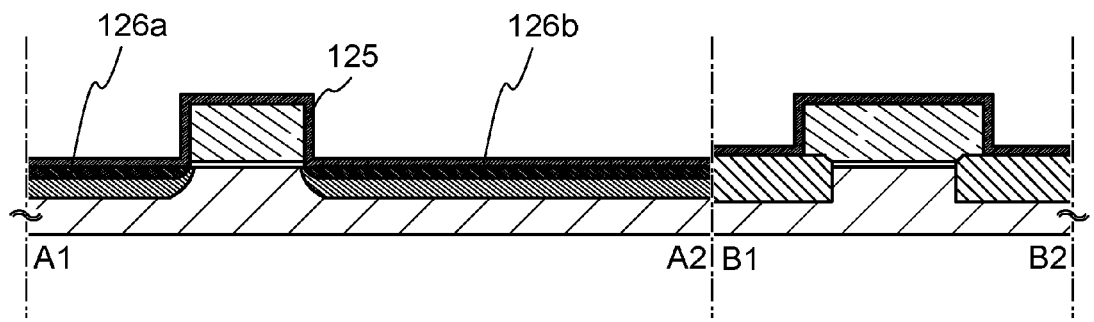
FIGS. 4A to 4C are cross-sectional views illustrating steps of forming a semiconductor device.

Next, a metal layer 125 is formed to cover the gate electrode 128, the impurity regions 124a and 124b, and the like (see FIG. 4A). The metal layer 125 can be formed by a variety of deposition methods such as vacuum vapor deposition, sputtering, or spin coating. The metal layer 125 is preferably formed using a metal material that reacts with a semiconductor material included in the semiconductor region 104 to form a low-resistance metal compound. Examples of such a metal material include titanium, tantalum, tungsten, nickel, cobalt, and platinum.

Then, heat treatment is performed so that the metal layer 125 reacts with the semiconductor material. Thus, the metal compound regions 126a and 126b that are in contact with the impurity regions 124a and 124b are formed (see FIG. 4A). Note that in the case where polycrystalline silicon or the like is used for the gate electrode 128, a metal compound region is also formed in a portion of the gate electrode 128 that is in contact with the metal layer 125.

As the heat treatment, irradiation with a flash lamp can be employed, for example. Although it is needless to say that different heat treatment may be employed, a method by which heat treatment for an extremely short time can be achieved is preferably employed in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and can improve element characteristics. The metal layer 125 is removed after the formation of the metal compound regions 126a and 126b.

Figure 4B:
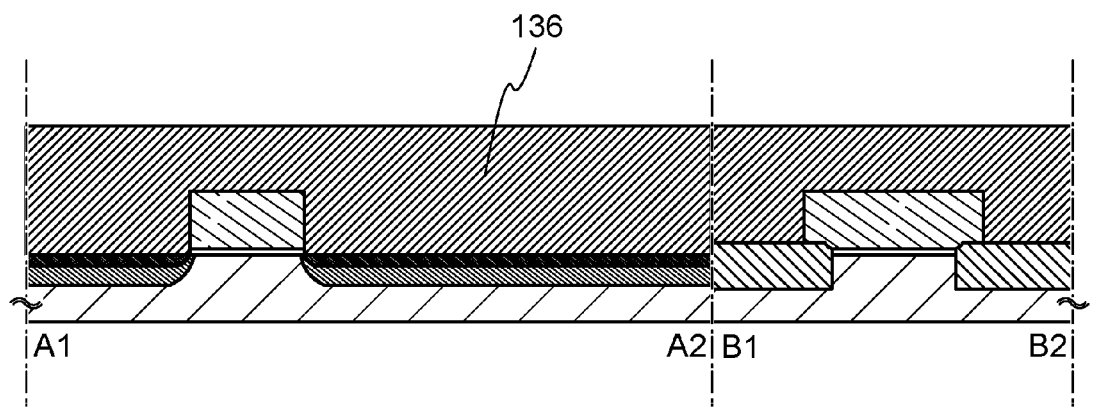

Then, the insulating layer 136 is formed to cover the components formed in the above steps (see FIG. 4B). The insulating layer 136 can be formed using a material including an inorganic insulating material such as silicon oxide, silicon oxynitride, silicon nitride oxide, silicon nitride, or aluminum oxide. In particular, the insulating layer 136 is preferably formed using a low dielectric constant (low-k) material because capacitance caused by the overlap of electrodes or wirings can be sufficiently reduced. Note that a porous insulating layer including any of these materials may be used for the insulating layer 136. Since the porous insulating layer has lower dielectric constant than a dense insulating layer, capacitance caused by the overlap of electrodes or wirings can be further reduced. Alternatively, the insulating layer 136 can be formed using an organic insulating material such as polyimide or acrylic. There is no particular limitation on the method for forming the insulating layer 136, and a variety of deposition methods such as vapor deposition, CVD, sputtering, or spin coating can be used. The semiconductor device can be formed with higher efficiency by CVD or the like whose deposition rate is high. In this embodiment, the case where the insulating layer 136 is formed using silicon oxide by CVD is described. The insulating layer 136 may have a single-layer structure or a layered structure of two or more layers.

Figure 4C:
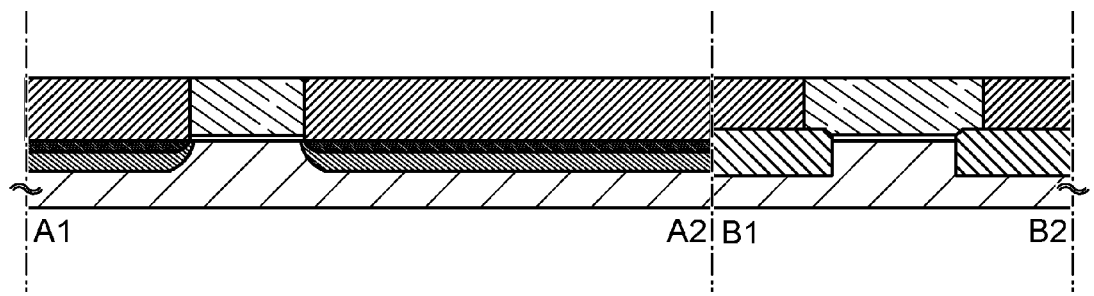

CMP treatment is performed on the insulating layer 136 so that a top surface of the gate electrode 128 is exposed (see FIG. 4C). In that case, it is preferable to flatten the insulating layer 136 so that a top surface of the insulating layer 136 and the top surface of the gate electrode 128 form substantially the same plane. When the surfaces of the insulating layer 136 and the gate electrode 128 are flattened in this manner, an electrode, a wiring, an insulating layer, a semiconductor layer, and the like can be favorably formed in later steps.

Here, the CMP treatment is treatment for flattening a surface of an object by a combination of chemical and mechanical actions using the surface as a reference. In general, the CMP treatment is treatment in which a polishing cloth is attached to a polishing stage, the polishing stage and the object are each rotated or swung while a slurry (an abrasive) is supplied between the object and the polishing cloth, and the surface of the object is polished by chemical reaction of the slurry and the surface of the object and by action of mechanical polishing of the object with the polishing cloth.

The CMP treatment may be performed once or more than once. When the CMP treatment is performed more than once, it is preferable that first polishing be preferably performed at a high polishing rate and then final polishing be preferably performed at a low polishing rate. By performing polishing at different polishing rates, the flatness of the surface of the insulating layer 136 can be further improved.

Figure 5A:
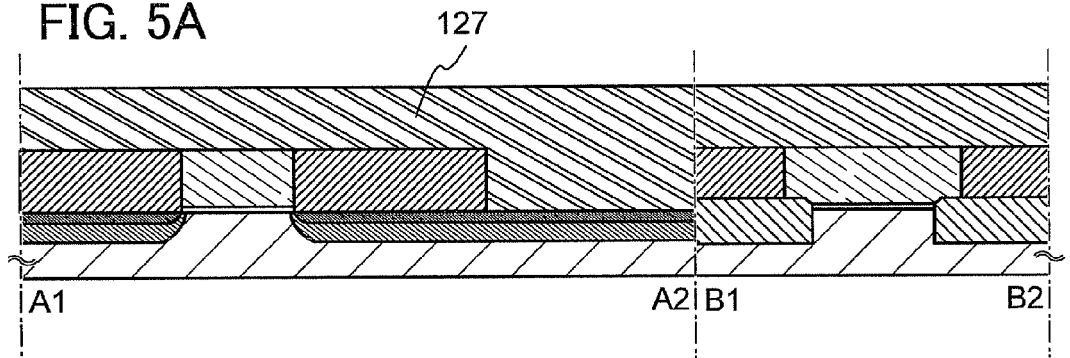
FIGS. 5A to 5D are cross-sectional views illustrating steps of forming a semiconductor device.

Next, an opening that reaches the metal compound region 126b is formed in the insulating layer 136, and a conductive layer 127 is formed to fill the opening (see FIG. 5A). The connection electrode 129 is formed in the opening. Thus, when the opening extends in the A1-A2 direction to overlap with the oxide semiconductor layer 144 to be formed later, the contact resistance between the connection electrode 129 and the metal compound region 126b can be reduced without an increase in the area of the semiconductor device.

The opening can be formed by a method such as etching using a mask. The mask can be formed by a method such as exposure using a photomask. Either wet etching or dry etching may be used as the etching; however, dry etching is preferably used in terms of microfabrication. The conductive layer 127 can be formed using a material and a method that are similar to those of the layer containing a conductive material that is used as the gate electrode 128.

Specifically, it is possible to use a method, for example, in which a thin titanium film is formed in a region including the opening by PVD, a thin titanium nitride film is formed by CVD, and then a tungsten film is formed to fill the opening. Here, the titanium film formed by PVD has a function of reducing an oxide film formed at an interface and lowering the contact resistance with the metal compound region 126b. The titanium nitride film formed after the formation of the titanium film has a barrier function of inhibiting diffusion of the conductive material.

Figure 5B:
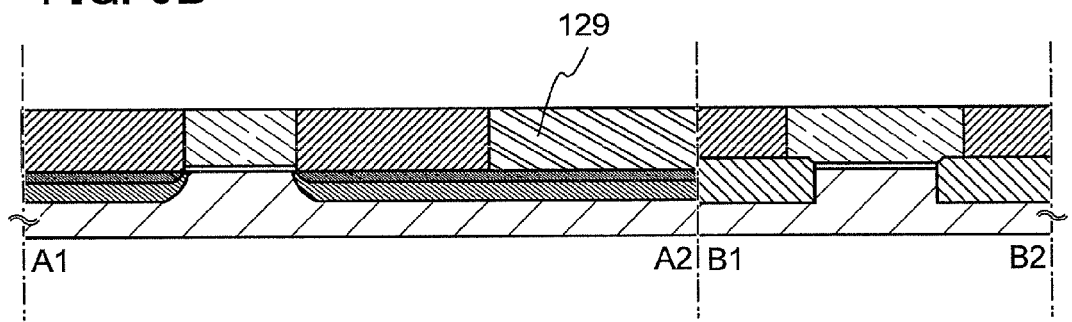

After the conductive layer 127 is formed, part of the conductive layer 127 is removed by a method such as etching or CMP, so that the insulating layer 136 is exposed and the connection electrode 129 is formed (see FIG. 5B). Note that in the case where the connection electrode 129 is formed by removal of part of the conductive layer 127, it is preferable to flatten the surfaces of the insulating layer 136 and the connection electrode 129. When the surfaces of the insulating layer 136 and the connection electrode 129 are flattened in this manner, an electrode, a wiring, an insulating layer, a semiconductor layer, and the like can be favorably formed in later steps.

Figure 5C:
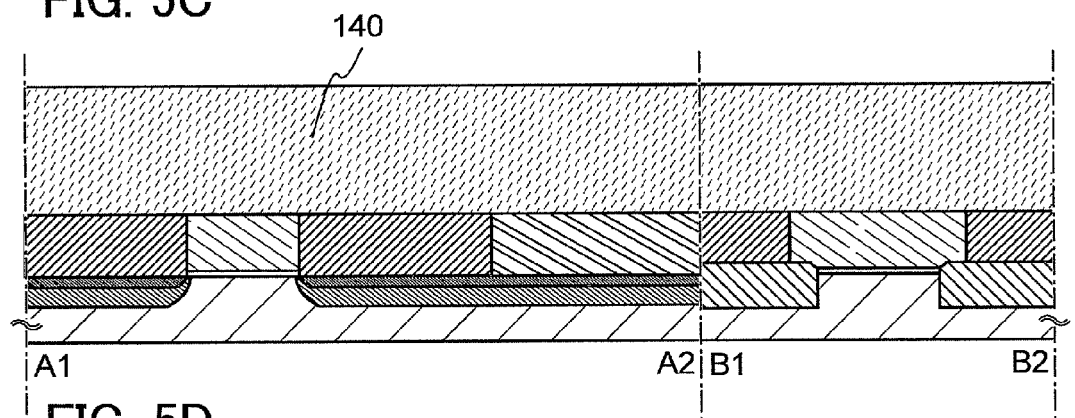

Next, the insulating layer 140 is formed to cover the components formed in the above steps (see FIG. 5C). The insulating layer 140 can be formed using a material and a method that are similar to those of the insulating layer 136. However, since the insulating layer 140 is in contact with the oxide semiconductor layer 144 in a later step, the insulating layer 140 preferably contains a sufficient amount of oxygen, more preferably contains a large amount of oxygen which exceeds at least the stoichiometric proportion in (a bulk of) the film. For example, in the case where a silicon oxide film is used as the insulating layer 140, the composition formula is $SiO_{2+\alpha}$ ($\alpha>0$). With the use of the insulating layer 140, oxygen can be supplied to the oxide semiconductor layer 144, so that the characteristics of the transistor 162 can be improved. The proportion of oxygen in the insulating layer 140 is preferably higher than the proportion of oxygen in the insulating layer 136.

Further, it is preferable that an impurity such as hydrogen be sufficiently removed from the insulating layer 140 and that the concentration of hydrogen in the insulating layer 140 be lower than the concentration of hydrogen in the insulating layer 136. Thus, it is still preferable to form the insulating layer 140 by sputtering with which an impurity such as hydrogen is hardly contained. In this embodiment, the case where the insulating layer 140 is formed using silicon oxide by sputtering is described. The insulating layer 140 may have a single-layer structure or a layered structure of two or more layers.

In this embodiment, an insulating layer for covering the transistor 160 has a layered structure of the insulating layer 136 and the insulating layer 140; however, this embodiment is not limited thereto. The insulating layer for covering the transistor 160 may have a single-layer structure or a layered structure of two or more layers.

Figure 5D:
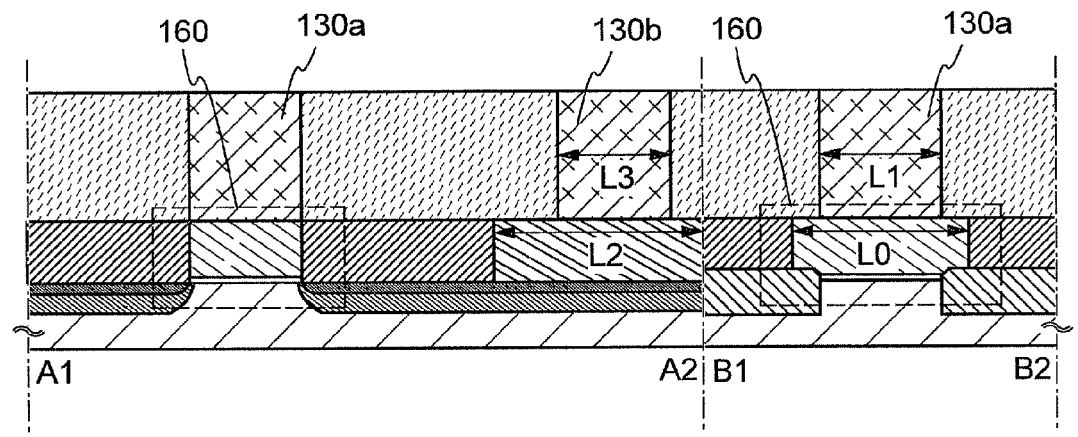

Then, an opening that reaches the gate electrode 128 and an opening that reaches the connection electrode 129 are formed in the insulating layer 140, a conductive layer is formed to fill the openings, part of the conductive layer is removed so that the insulating layer 140 is exposed, and the connection electrodes 130a and 130b are formed (see FIG. 5D).

The openings in the insulating layer, the conductive layer, the connection electrodes 130a and 130b can be formed by a method that is similar to the method for forming the connection electrode 129 in FIGS. 5A and 5B. Note that since the length $L_1$ of the connection electrode 130a is shorter than the length $L_0$ of the gate electrode 128 and the length $L_3$ of the connection electrode 130b is shorter than the length $L_2$ of the connection electrode 129 as described in the above embodiment, it is necessary to provide the openings in the insulating layer 140 in which the connection electrodes 130a and 130b are formed, depending on the lengths.

Here, the length $L_1$ of the connection electrode 130a is preferably 0.5 times or more and less than 1 times the length $L_0$ of the gate electrode 128, and the minimum feature size (F) is preferably 1 F or more and less than 2 F, more preferably about 1 F. Further, the length $L_3$ of the connection electrode 130b is preferably 0.5 times or more and less than 1 times the length $L_2$ of the connection electrode 129, and the minimum feature size (F) is preferably 1 F or more and less than 2 F, more preferably about 1 F.

When the connection electrodes 130a and 130b are formed in this manner, the area of the drain electrode 142b that is in contact with the connection electrode 130a and the area of the source electrode 142a that is in contact with the connection electrode 130*b* are decreased. Thus, the area of the semiconductor device can be decreased. Further, when a storage device including the semiconductor devices in this embodiment that are arrayed as memory cells is formed, the effect of decrease in area can be obtained in accordance with the number of memory cells. Thus, the storage device can be highly integrated effectively, and storage capacity per unit area can be increased.

Note that in the case where the connection electrodes 130*a* and 130*b* are formed by removal of part of the conductive layer, it is preferable to flatten the surfaces of the insulating layer 140 and the connection electrodes 130*a* and 130*b*. When the surfaces of the insulating layer 140 and the connection electrodes 130*a* and 130*b* are flattened in this manner, an electrode, a wiring, an insulating layer, a semiconductor layer, and the like can be favorably formed in later steps.

Through the above steps, the transistor 160 using the semiconductor substrate 100 is formed (see FIG. 5D). The transistor 160 can operate at high speed. Thus, when the transistor is used as a reading transistor and a transistor for selecting a memory cell during reading, data can be read at high speed.

Note that before or after the steps, a step of forming an electrode, a wiring, a semiconductor layer, an insulating layer, or the like may be further performed. For example, a multilayer wiring structure in which an insulating layer and a conductive layer are stacked is employed as a wiring structure, so that a highly integrated semiconductor device can be obtained.

<Method for Forming Transistor in Upper Portion>

Next, a method for forming the transistor 162 in an upper portion is described with reference to FIGS. 6A to 6C, FIGS. 7A and 7B, and FIGS. 8A and 8B.

Figure 6A:
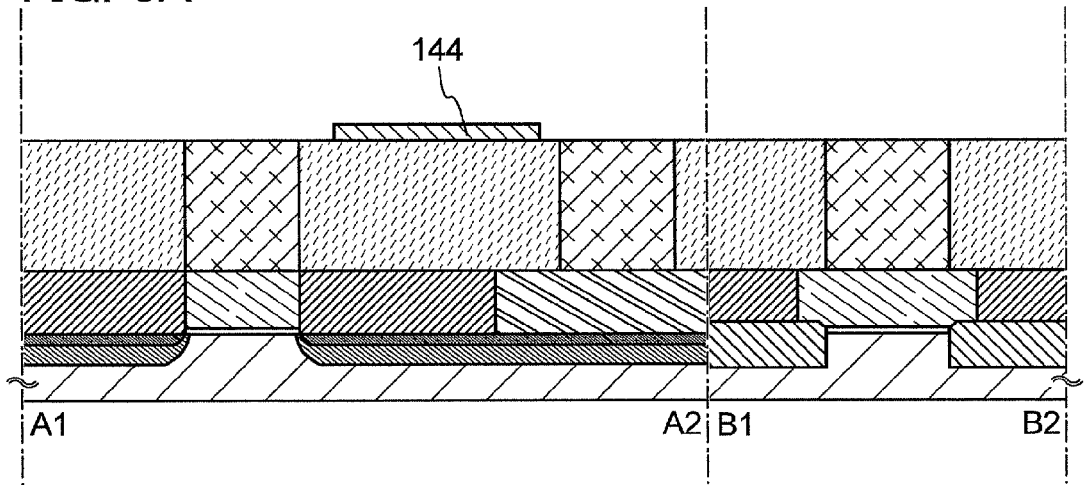
FIGS. 6A to 6C are cross-sectional views illustrating steps of forming a semiconductor device.

First, an oxide semiconductor layer is formed over the connection electrodes 130*a* and 130*b* and the insulating layer 140 and is processed, so that the island-shaped oxide semiconductor layer 144 is formed (see FIG. 6A). Note that an insulating layer functioning as a base may be formed over the insulating layer 140 before the oxide semiconductor layer is formed. The insulating layer can be formed by PVD such as sputtering, CVD such as plasma-enhanced CVD, or the like.

The oxide semiconductor layer contains at least any of indium (In), zinc (Zn), and tin (Sn). In particular, the oxide semiconductor layer preferably contains In and Zn. As a stabilizer for reducing variation in electrical characteristics of a transistor including the oxide, the oxide semiconductor layer preferably contains gallium (Ga) in addition to In and Zn. Tin (Sn) is preferably contained as a stabilizer. Hafnium (Hf) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, or an In—Sn—Hf—Zn-based oxide can be used.

Here, for example, an In—Ga—Zn-based oxide means an oxide containing indium (In), gallium (Ga), and zinc (Zn) as main components, and there is no limitation on the ratio of In, Ga, and Zn. Further, the In—Ga—Zn-based oxide may contain an element other than In, Ga, and Zn.

The oxide semiconductor layer can be a thin film formed using a material expressed by a chemical formula, $InMO_3(ZnO)_m$ (m>0). Here, M represents one or more metal elements selected from Ga, Al, Mn, or Co. For example, M can be Ga, Ga and Al, Ga and Mn, Ga and Co, or the like.

The thickness of the oxide semiconductor layer is 1 to 100 nm, preferably 3 to 30 nm.

The oxide semiconductor layer 144 can be formed by sputtering, a molecular beam epitaxy (MBE) method, CVD, a pulse laser deposition method, an atomic layer deposition (ALD) method, a coating method, a printing method, or the like as appropriate. The oxide semiconductor layer 144 may be formed using a sputtering system which performs deposition with surfaces of a plurality of substrates set substantially perpendicular to a surface of a sputtering target, which is a so-called columnar plasma (CP) sputtering system.

Note that the oxide semiconductor layer is preferably formed by a method in which an impurity such as hydrogen, water, a hydroxyl group, or hydride does not enter the oxide semiconductor layer easily. The oxide semiconductor layer is preferably formed by sputtering or the like.

In this embodiment, the oxide semiconductor layer is formed by sputtering using an In—Ga—Zn—O-based oxide target.

As the In—Ga—Zn—O-based oxide target, for example, an oxide target with a composition ratio of $In_2O_3:Ga_2O_3:ZnO=1:1:1$ (in a molar ratio) can be used. Note that it is not necessary to limit the material and the composition ratio of the target to the above. For example, an oxide target with a composition ratio of $In_2O_3:Ga_2O_3:ZnO=1:1:2$ (in a molar ratio) or an oxide target with a composition ratio of $In_2O_3:Ga_2O_3:ZnO=3:1:4$ (in a molar ratio) can be used.

In the case where an In—Zn—O-based material is used for the oxide semiconductor, a target used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), more preferably In:Zn=15:1 to 1.5:1 in an atomic ratio ($In_2O_3:ZnO=15:2$ to 3:4 in a molar ratio). For example, a target used for deposition of an In—Zn—O-based oxide semiconductor has a composition ratio of In:Zn:O=X:Y:Z in an atomic ratio, where Z>1.5X+Y.

The filling factor of the oxide target is 90 to 100%, preferably 95 to 99.9%. With the use of a metal oxide target with a high filling factor, a dense oxide semiconductor layer can be formed.

The deposition atmosphere may be a rare gas (typically argon) atmosphere, an oxygen atmosphere, or a mixed atmosphere containing a rare gas and oxygen. It is preferable to employ an atmosphere using a high-purity gas from which an impurity such as hydrogen, water, a hydroxyl group, or hydride is removed so that hydrogen, water, a hydroxyl group, hydride, or the like can be prevented from entering the oxide semiconductor layer.

For example, the oxide semiconductor layer can be formed as follows.

First, the substrate is held in a deposition chamber kept under reduced pressure, and is heated so that the substrate temperature is higher than 200° C. and lower than or equal to 500° C., preferably higher than 300° C. and lower than or equal to 500° C., more preferably higher than or equal to 350° C. and lower than or equal to 450° C.

Then, a high-purity gas from which an impurity such as hydrogen, water, a hydroxyl group, or hydride is sufficiently removed is introduced while moisture remaining in the deposition chamber is removed, and the oxide semiconductor layer is formed over the substrate with the use of the target. In order to remove moisture remaining in the deposition chamber, an adsorption vacuum pump such as a cryopump, an ion pump, or a titanium sublimation pump is preferably used. A turbo pump to which a cold trap is added may be used as an exhaustion means. In the deposition chamber which is exhausted with the cryopump, for example, an impurity such as hydrogen, water, a hydroxyl group, or hydride (preferably a compound containing a carbon atom) and the like are removed. Thus, the concentration of an impurity such as hydrogen, water, a hydroxyl group, or hydride contained in the oxide semiconductor layer deposited in the deposition chamber can be lowered.

In the case where the substrate temperature is low (for example, 100° C. or lower) during deposition, a substance including a hydrogen atom might enter the oxide semiconductor; thus, it is preferable that the substrate be heated at a temperature in the above range. When the oxide semiconductor layer is deposited with the substrate heated at the temperature, the substrate temperature is increased, so that hydrogen bonds are cut by heat and are less likely to be taken into the oxide semiconductor layer. Thus, the oxide semiconductor layer is deposited with the substrate heated at the temperature, so that the concentration of an impurity such as hydrogen, water, a hydroxyl group, or hydride contained in the oxide semiconductor layer can be sufficiently reduced. In addition, damage due to sputtering can be reduced.

An example of the deposition condition is as follows: the distance between the substrate and the target is 60 mm, the pressure is 0.4 Pa, the DC power is 0.5 kW, the substrate temperature is 400° C., and the deposition atmosphere is an oxygen atmosphere (the proportion of the oxygen flow rate is 100%). Note that a pulsed DC power source is preferable because powdery substances (also referred to as particles or dust) generated during the deposition can be reduced and the film thickness can be uniform.

Note that before the oxide semiconductor layer is deposited by sputtering, powdery substances (also referred to as particles or dust) which attach to a surface over which the oxide semiconductor layer is formed are preferably removed by reverse sputtering in which an argon gas is introduced and plasma is generated. The reverse sputtering is a method in which voltage is applied to a substrate and plasma is generated in the vicinity of the substrate so that a surface of the substrate side is modified. Note that instead of argon, a gas such as nitrogen, helium, or oxygen may be used.

The oxide semiconductor layer can be processed by etching after a mask with a desired shape is formed over the oxide semiconductor layer. The mask can be formed by a method such as photolithography. Alternatively, the mask may be formed by a method such as an inkjet method. Note that the etching of the oxide semiconductor layer may be either dry etching or wet etching. Needless to say, dry etching and wet etching may be employed in combination. Here, the processed oxide semiconductor layer 144 is provided to partly overlap with at least the source region or the drain region of the transistor 160. When the oxide semiconductor layer 144 is provided in this manner, the semiconductor device can be highly integrated.

After that, heat treatment (first heat treatment) may be performed on the oxide semiconductor layer 144. By the heat treatment, substances including hydrogen atoms in the oxide semiconductor layer 144 are removed; thus, the structure of the oxide semiconductor layer 144 can be improved and defect levels in the energy gap can be reduced. The heat treatment is performed at 250 to 700° C., preferably 450 to 600° C. or lower than the strain point of the substrate in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon, which is introduced into a heat treatment apparatus, is 6 N (99.9999%) or more, preferably 7 N (99.99999%) (that is, the impurity concentration is 1 ppm or lower, preferably 0.1 ppm or lower).

The heat treatment can be performed in such a manner that, for example, an object is introduced into an electric furnace in which a resistance heater or the like is used at 450° C. for 1 h in a nitrogen atmosphere. The oxide semiconductor layer 144 is not exposed to the air during the heat treatment so that entry of water or hydrogen can be prevented.

The impurities are reduced by the heat treatment so that an intrinsic (i-type) or substantially intrinsic oxide semiconductor layer is formed. Accordingly, a transistor with extremely excellent characteristics can be obtained.

The heat treatment can be referred to as dehydration treatment, dehydrogenation treatment, or the like because of its advantageous effect of removing hydrogen, water, or the like. The heat treatment can be performed, for example, before the oxide semiconductor layer is processed into an island shape, after the gate insulating film is formed, or the like. Such dehydration treatment or dehydrogenation treatment may be performed more than once.

In the case where the oxide semiconductor layer 144 has CAAC, the oxide semiconductor layer 144 is preferably formed by sputtering. In order to obtain CAAC by sputtering, it is important to form hexagonal crystals in an initial stage of deposition of an oxide semiconductor film and to cause crystal growth from the hexagonal crystals as seed crystals. In order to achieve this, it is preferable that the distance between the target and the substrate be made longer (e.g., approximately 150 to 200 mm) and that a substrate heating temperature be 100 to 500° C., preferably 200 to 400° C., more preferably 250 to 300° C. In addition, the deposited oxide semiconductor film is subjected to heat treatment at a temperature higher than the substrate heating temperature during the deposition. Thus, micro defects in the film and defects at an interface between stacked layers can be repaired.

Figure 6B:
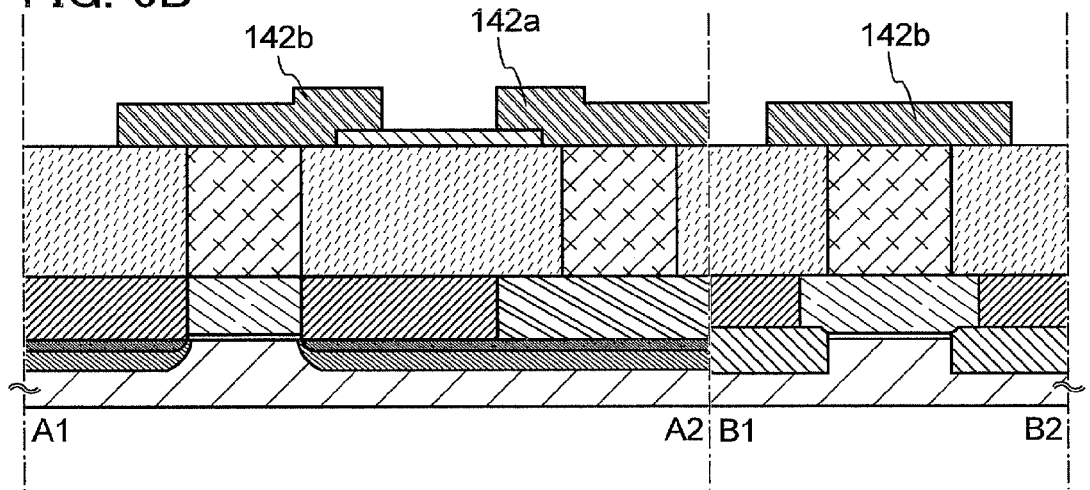

Next, a conductive layer to be a source electrode and a drain electrode (including a wiring formed using the same layer as the source electrode and the drain electrode) is formed over the oxide semiconductor layer 144 and the like and is processed, so that the source electrode 142$a$ and the drain electrode 142$b$ are formed (see FIG. 6B). Here, the source electrode 142$a$ and the drain electrode 142$b$ are electrically connected to the connection electrode 130$b$ and the connection electrode 130$a$, respectively.

The conductive layer can be formed by PVD or CVD. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

The conductive layer can have a single-layer structure or a layered structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked.

Alternatively, the conductive layer may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used.

The channel length (L) of the transistor in the upper portion depends on a distance between a lower end portion of the source electrode 142a and a lower end portion of the drain electrode 142b. Note that for exposure for forming a mask used during formation of a transistor with a channel length (L) of less than 25 nm, it is preferable to use extreme ultraviolet rays whose wavelength is as short as several nanometers to several tens of nanometers. In the exposure by extreme ultraviolet rays, the resolution is high and the focus depth is large. Accordingly, the channel length (L) of the transistor to be formed later can be 10 nm to 1000 nm (1 μm), and the circuit can operate at higher speed. Further, the power consumption of the semiconductor device can be reduced by miniaturization.

Figure 6C:
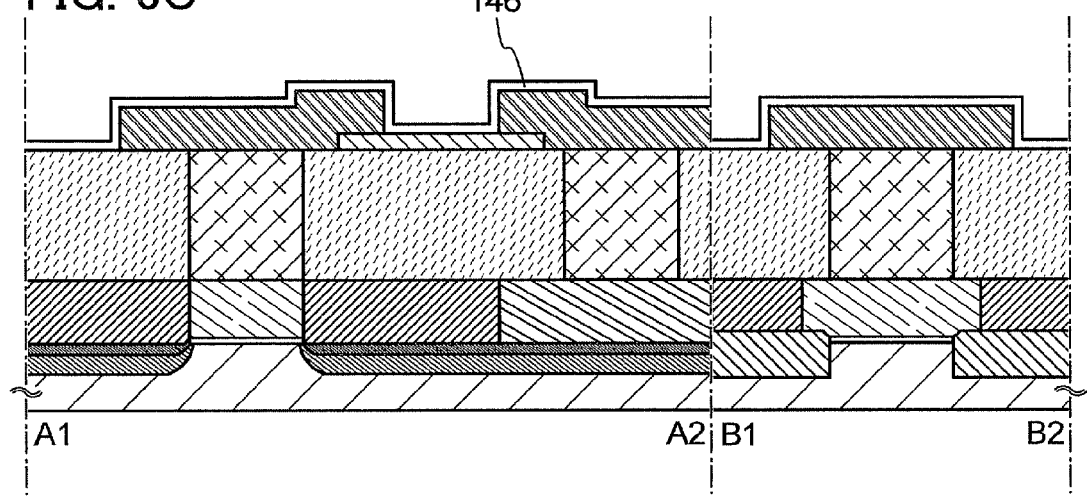

Next, the gate insulating layer 146 is formed to cover the source electrode 142a and the drain electrode 142b and to be in contact with part of the oxide semiconductor layer 144 (see FIG. 6C).

The gate insulating layer 146 can be formed by CVD, sputtering, or the like. The gate insulating layer 146 is preferably formed to contain silicon oxide, silicon nitride, silicon oxynitride, silicon nitride oxide, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure in which these elements are combined. There is no particular limitation on the thickness of the gate insulating layer 146; however, in the case where the semiconductor device is miniaturized, the thickness is preferably small in order to secure the operation of the transistor. For example, in the case where silicon oxide is used, the thickness of the gate insulating layer 146 can be 1 to 100 nm, preferably 10 to 50 nm.

When the gate insulating layer 146 is thin as described above, gate leakage due to a tunneling effect or the like becomes problematic. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electrical characteristics can be secured and the thickness can be increased in order to reduce gate leakage. Note that a layered structure of a film containing a high-k material and a film containing any of silicon oxide, silicon nitride, silicon oxynitride, silicon nitride oxide, aluminum oxide, or the like may be employed.

Further, an insulating layer which is in contact with the oxide semiconductor layer 144 (in this embodiment, the gate insulating layer 146) may be formed using an insulating material containing an element that belongs to Group 13 and oxygen. Many oxide semiconductor materials contain elements that belong to Group 13, and an insulating material containing an element that belongs to Group 13 is compatible with an oxide semiconductor. Thus, when an insulating material containing an element that belongs to Group 13 is used for the insulating layer that is in contact with the oxide semiconductor layer, an interface with the oxide semiconductor layer can be kept well.

Here, an insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where a gate insulating layer is formed in contact with an oxide semiconductor layer containing gallium, when a material containing gallium oxide is used for the gate insulating layer, favorable characteristics can be kept at the interface between the oxide semiconductor layer and the gate insulating layer. When the oxide semiconductor layer and the insulating layer containing gallium oxide are provided in contact with each other, the pileup of hydrogen at the interface between the oxide semiconductor layer and the insulating layer can be reduced. Note that a similar effect can be obtained in the case where an element that belongs to the same group as a constituent element of the oxide semiconductor is used for the insulating layer. For example, it is effective to form the insulating layer with the use of a material containing aluminum oxide. Aluminum oxide does not easily transmit water. Thus, it is preferable to use the material containing aluminum oxide in order to prevent water from entering the oxide semiconductor layer.

The insulating layer which is in contact with the oxide semiconductor layer 144 preferably contains oxygen in a proportion higher than that in the stoichiometric composition, by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where a silicon oxide film is used for the gate insulating layer 146, the composition formula is $SiO_{2+\alpha}$ (α>0). In this embodiment, a silicon oxide film of $SiO_{2+\alpha}$ (α>0) is used for the gate insulating layer 146.

For example, in the case where the insulating layer which is in contact with the oxide semiconductor layer 144 is formed using gallium oxide, the composition of gallium oxide can be $Ga_2O_X$ (X=3+α, 0<α<1) by heat treatment in an oxygen atmosphere or oxygen doping. In the case where the insulating layer which is in contact with the oxide semiconductor layer 144 is formed using aluminum oxide, the composition of aluminum oxide can be $Al_2O_X$ (X=3+α, 0<α<1) by heat treatment in an oxygen atmosphere or oxygen doping. In the case where the insulating layer which is in contact with the oxide semiconductor layer 144 is formed using gallium aluminum oxide (aluminum gallium oxide), the composition of gallium aluminum oxide (aluminum gallium oxide) can be $Ga_xAl_{2-x}O_{3+\alpha}$ ($0<X<2$, $0<\alpha<1$) by heat treatment in an oxygen atmosphere or oxygen doping.

By oxygen doping or the like, an insulating layer including a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at the interface between the oxide semiconductor layer and the insulating layer is reduced. Thus, the oxide semiconductor layer can be intrinsic (i-type) or substantially intrinsic.

Note that the insulating layer including a region where the proportion of oxygen is higher than that in the stoichiometric composition may be applied to the insulating layer serving as a base film of the oxide semiconductor layer 144 instead of the gate insulating layer 146, or may be applied to both the gate insulating layer 146 and a base insulating layer.

After the gate insulating layer 146 is formed, second heat treatment is preferably performed in an inert gas atmosphere or an oxygen atmosphere. The temperature of the heat treatment is 200 to 450° C., preferably 250 to 350° C. For example, the heat treatment may be performed at 250° C. for 1 h in a nitrogen atmosphere. The second heat treatment can reduce variations in electrical characteristics of the transistor. Further, in the case where the gate insulating layer 146 includes oxygen, oxygen can be supplied to the oxide semiconductor layer 144 and oxygen vacancies in the oxide semiconductor layer 144 can be filled; thus, an intrinsic (i-type) or substantially intrinsic oxide semiconductor layer can be formed.

Note that in this embodiment, the second heat treatment is performed after the gate insulating layer 146 is formed; however, the timing of the second heat treatment is not limited thereto. For example, the second heat treatment may be performed after the gate electrode is formed. Alternatively, the first heat treatment and the second heat treatment may be performed successively, the first heat treatment may serve as the second heat treatment, or the second heat treatment may serve as the first heat treatment.

At least one of the first heat treatment and the second heat treatment is performed as described above, whereby the oxide semiconductor layer 144 can be highly purified to contain the substances including hydrogen atoms as little as possible.

Figure 7A:
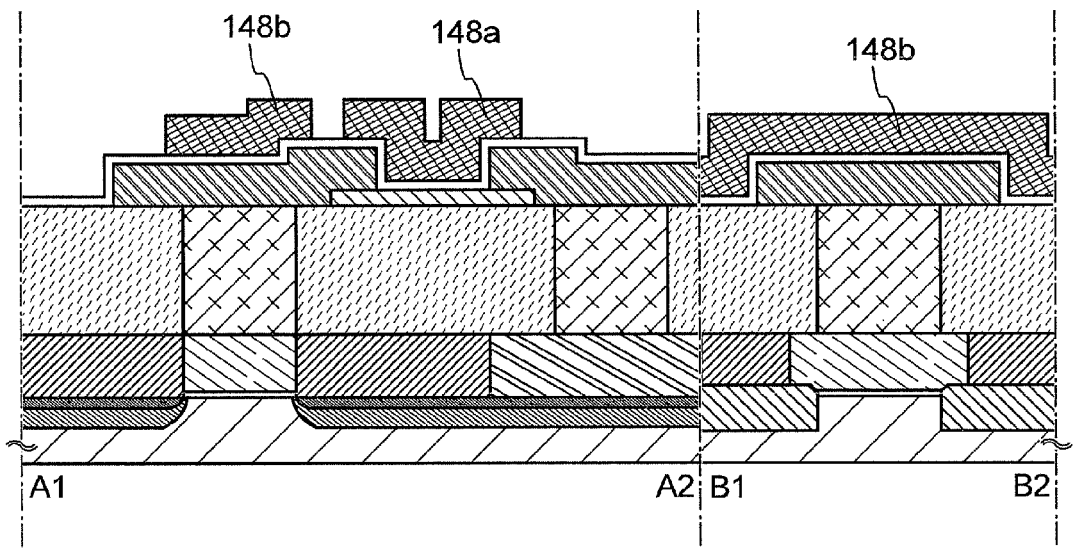
FIGS. 7A and 7B are cross-sectional views illustrating steps of forming a semiconductor device.

Next, a conductive layer used for forming a gate electrode (including a wiring formed using the same layer as the gate electrode) is formed and processed, so that the gate electrode 148a and the conductive layer 148b are formed (see FIG. 7A).

The gate electrode 148a and the conductive layer 148b can be formed using a metal material such as molybdenum, titanium, tantalum, tungsten, aluminum, copper, neodymium, or scandium, or an alloy material containing any of these materials as its main component. Note that the gate electrode 148a and the conductive layer 148b may have a single-layer structure or a layered structure.

As one layer of the gate electrode 148a which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film is preferably used. These films each have a work function of 5 eV or higher, preferably 5.5 eV or higher. The use of any of these films as the gate electrode makes the threshold voltage of the transistor positive. Accordingly, a so-called normally off switching element can be obtained.

Figure 7B:
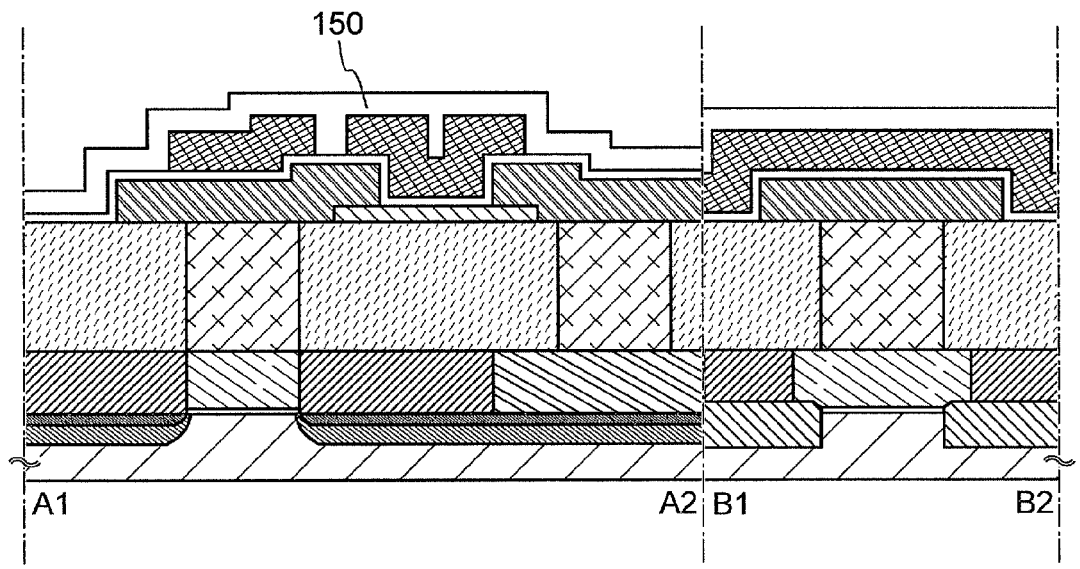

Next, the insulating layer 150 is formed over the gate insulating layer 146, the gate electrode 148a, and the conductive layer 148b (see FIG. 7B). The insulating layer 150 can be formed by PVD, CVD, or the like. The insulating layer 150 can be formed using a material including an inorganic insulating material such as silicon oxide, silicon oxynitride, silicon nitride oxide, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because when the insulating layer 150 has a low dielectric constant, capacitance generated between wirings, electrodes, or the like can be reduced and operation speed can be increased.

Figure 8A:
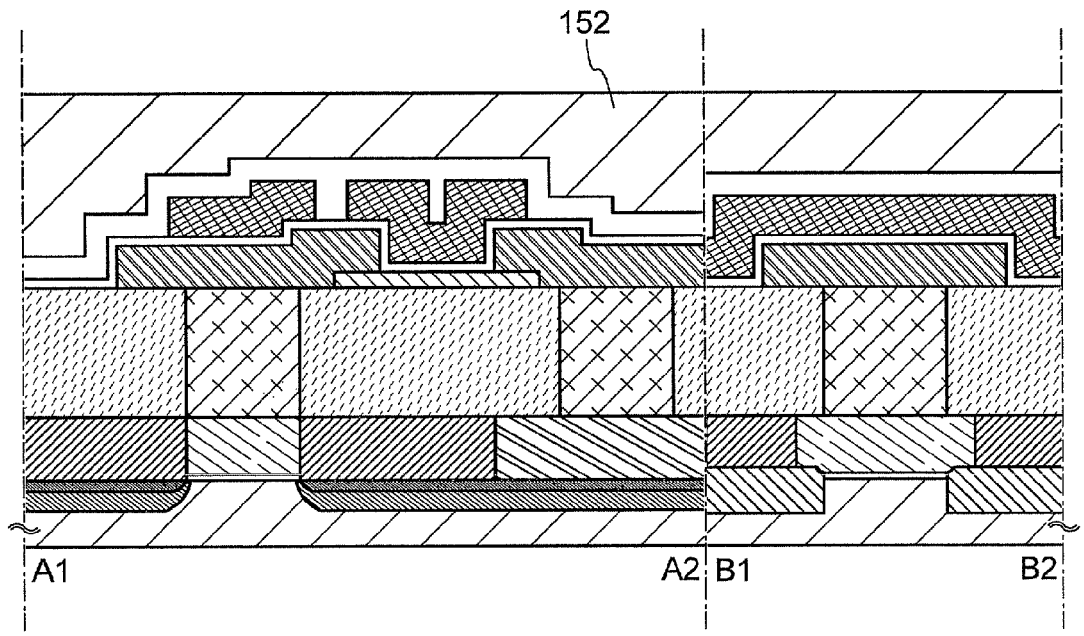
FIGS. 8A and 8B are cross-sectional views illustrating steps of forming a semiconductor device.

Then, the insulating layer 152 that functions as a flattening film is formed over the insulating layer 150 (see FIG. 8A). The insulating layer 152 may be any insulating film as long as it functions as a flattening film. For example, an organic insulating material such as polyimide or acrylic can be used. When a surface of the insulating layer 152 is flattened in this manner, an electrode, a wiring, an insulating layer, a semiconductor layer, and the like can be favorably formed in later steps in the case where the later steps include steps of forming an electrode, a wiring, an insulating layer, a semiconductor layer, and the like.

Note that although a layered structure of the insulating layer 150 and the insulating layer 152 is used in this embodiment, one embodiment of the disclosed invention is not limited to this structure. A single-layer structure or a layered structure of two or more layers may be used.

Next, an opening reaching the source electrode 142a is formed in the gate insulating layer 146 and the insulating layers 150 and 152. Then, the wiring 154 connected to the source electrode 142a is formed over the insulating layer 152 (see FIG. 8B). Note that the opening is formed by selective etching using a mask or the like.

A conductive layer is formed by PVD or CVD and then is patterned, so that the wiring 154 is formed. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used. Here, the wiring 154 is provided to partly overlap with at least the oxide semiconductor layer 144. When the wiring 154 is provided in this manner, the semiconductor device can be highly integrated.

Specifically, for example, it is possible to employ a method in which a thin titanium film is formed in a region including the opening in the insulating layers 150 and 152 by PVD and a thin titanium film (with a thickness of about 5 nm) is formed by PVD, and then, an aluminum film is formed to fill the opening. Here, the titanium film formed by PVD has a function of reducing an oxide film (e.g., a natural oxide film) formed on a surface over which the titanium film is formed, to decrease the contact resistance with a lower electrode or the like (here, the source electrode 142a). In addition, generation of hillocks of the aluminum film can be prevented. A copper film may be formed by a plating method after a barrier film of titanium, titanium nitride, or the like is formed.

The opening formed in the insulating layers 150 and 152 is preferably formed in a region overlapping with the connection electrode 130b. With provision of the opening in such a region, an increase in element area due to a contact region can be inhibited.

As described in this embodiment, with the use of the connection electrode 130b, the contact in the upper portion can be formed without disconnection of the source electrode 142a. Thus, the contact in the lower portion and the contact in the upper portion can be formed to overlap with each other, so that an increase in element area due to a contact region can be inhibited. That is, the integration degree of the semiconductor device can be increased.

Figure 8B:
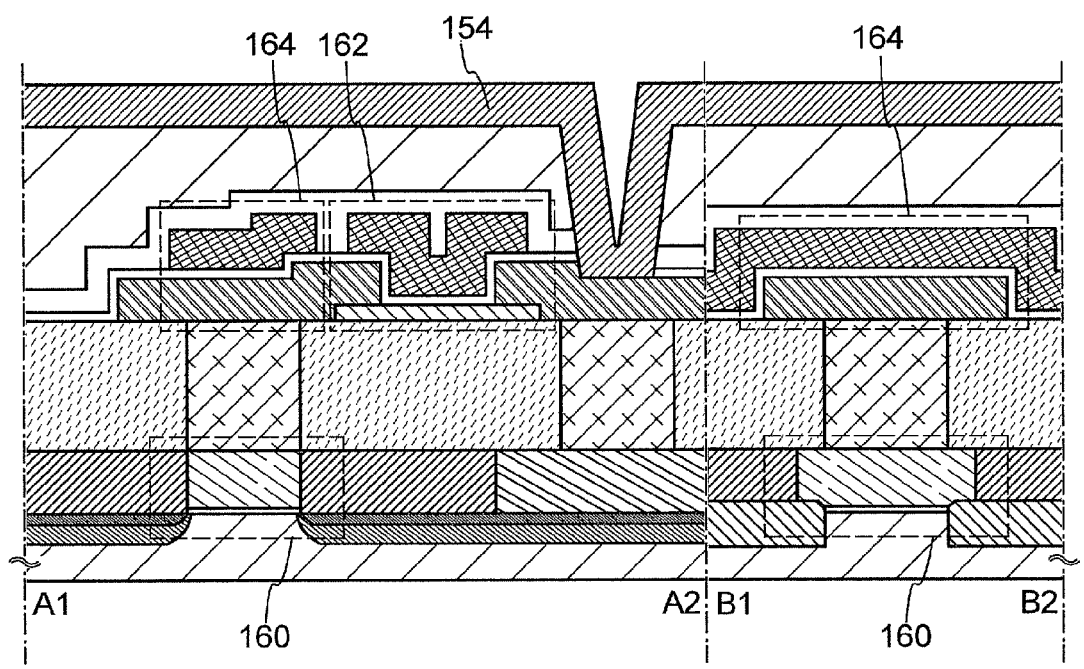

Through the steps, the transistor 162 including the highly purified oxide semiconductor layer 144 and the capacitor 164 are completed (see FIG. 8B).

In the transistor 162 in this embodiment, the oxide semiconductor layer 144 is highly purified; thus, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the carrier concentration of the oxide semiconductor layer 144 is much lower (e.g., lower than $1\times10^{12}$/cm$^3$, preferably lower than $1.45\times10^{10}$/cm$^3$) than that of a general silicon wafer (approximately $1\times10^{14}$/cm$^3$). Thus, the off-state current of the transistor 162 is also sufficiently low. For example, the off-state current (here, current per unit channel width (1 μm) at room temperature (25° C.) is 100 zA (1 zA (zeptoampere) is $1\times10^{-21}$ A) or lower, preferably 10 zA or lower.

With the use of the highly purified intrinsic oxide semiconductor layer 144, the off-state current of the transistor can be sufficiently reduced. Further, with the use of such a transistor, a semiconductor device in which stored data can be retained for an extremely long time can be obtained.

In the semiconductor device in this embodiment, a connection electrode for connecting the transistor including a semiconductor material other than an oxide semiconductor to the transistor including an oxide semiconductor material is made smaller than an electrode of the transistor including a semiconductor material other than an oxide semiconductor that is connected to the connection electrode. Thus, the area of the transistor including an oxide semiconductor material that is connected to the connection electrode can be decreased, so that a semiconductor device with a novel structure can be highly integrated and storage capacity per unit area can be increased.

As described above, the structures, methods, and the like described in this embodiment can be combined with any of the structures, methods, and the like described in the other embodiments as appropriate.

Embodiment 3

In this embodiment, a structure of a semiconductor device according to one embodiment of the present invention that is different from the structure of the semiconductor device in the above embodiment is described with reference to FIGS. 9A and 9B.

<Cross-Sectional Structure and Plan View of Semiconductor Device>

Figure 9A:
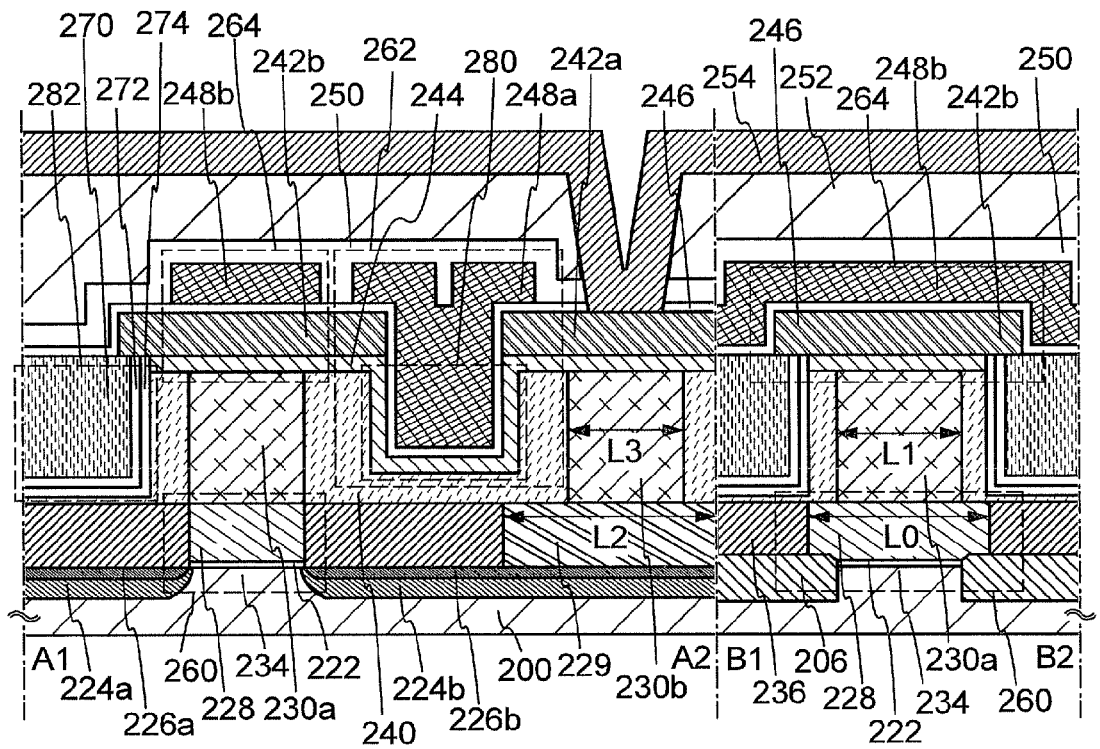
FIGS. 9A and 9B are a cross-sectional view and a plan view of a semiconductor device.
Figure 9B:
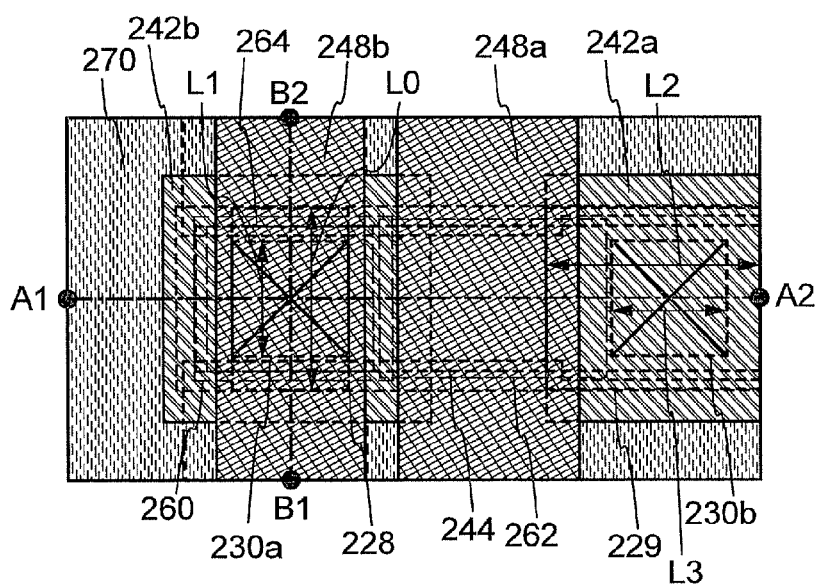

FIGS. 9A and 9B illustrate a structure example of a semiconductor device. FIG. 9A is a cross-sectional view of the semiconductor device, and FIG. 9B is a plan view of the semiconductor device. Line A1-A2 in FIG. 9A corresponds to line A1-A2 in FIG. 9B, and a cross-sectional view taken along line A1-A2 in FIG. 9A illustrates the semiconductor device in a direction parallel to the channel length direction of a transistor. Further, line B1-B2 in FIG. 9A corresponds to line B1-B2 in FIG. 9B, and a cross-sectional view taken along line B1-B2 in FIG. 9A illustrates the semiconductor device in a direction perpendicular to the channel length direction of the transistor.

A transistor 260 includes a channel formation region 234 provided in a semiconductor substrate 200, impurity regions 224a and 224b (also referred to as a source region and a drain region) provided in the semiconductor substrate 200 to sandwich the channel formation region 234, metal compound regions 226a and 226b that are in contact with the impurity regions 224a and 224b, a gate insulating layer 222 provided over the channel formation region 234, and a gate electrode 228 that overlaps with the channel formation region 234 and is provided over the gate insulating layer 222. A connection electrode 230a is provided on and in contact with the gate electrode 228. Further, a connection electrode 229 is provided on and in contact with the metal compound region 226b provided in the semiconductor substrate 200. Furthermore, a connection electrode 230b is provided on and in contact with the connection electrode 229. Element isolation insulating layers 206 are formed on the semiconductor substrate 200 to surround the transistor 260. Insulating layers 236 and 240 are stacked over the transistor 260 so that top surfaces of the connection electrodes 230a and 230b are exposed. These components are similar to the components of the semiconductor device described in the above embodiment with reference to FIGS. 1A and 1B except that a first trench 280 and a second trench 282 are formed in the insulating layer 240; thus, the above embodiment can be referred to for details of the components.

Here, the first trench 280 (also referred to as a groove) and the second trench 282 that is deeper than the first trench 280 are formed in the insulating layer 240. The first trench 280 overlaps with a channel formation region of an oxide semiconductor layer 244 to be described later and extends in a B1-B2 direction. The second trench 282 is provided to surround the oxide semiconductor layer 244. The first trench 280 and the second trench 282 can be formed by a known method.

The transistor 262 includes the oxide semiconductor layer 244 provided to be in contact with a bottom surface and an inner wall surface of the first trench 280 in the insulating layer 240; a source electrode 242a and a drain electrode 242b that are electrically connected to the oxide semiconductor layer 244; a gate insulating layer 246 for covering the oxide semiconductor layer 244, the source electrode 242a, and the drain electrode 242b; and a gate electrode 248a provided over the gate insulating layer 246 to overlap with the oxide semiconductor layer 244 and to fill the first trench 280. Here, the drain electrode 242b is provided to be electrically connected to the connection electrode 230a with the oxide semiconductor layer 244 provided therebetween. Accordingly, the potential of the gate electrode 228 of the transistor 260 can be held for an extremely long time taking advantage of the electric charge retention characteristics of the transistor 262. The source electrode 242a is provided to be electrically connected to the connection electrode 230b with the oxide semiconductor layer 244 provided therebetween. The oxide semiconductor layer 244 functions as a channel formation region of the transistor 262 and is provided to partly overlap with at least the source region or the drain region of the transistor 260. These components are similar to the components of the semiconductor device described in the above embodiment with reference to FIGS. 1A and 1B except that the shapes of the oxide semiconductor layer 244, the gate insulating layer 246, and the gate electrode 248a are changed and that the oxide semiconductor layer 244, the connection electrode 230a, and the connection electrode 230b are in contact with each other; thus, the above embodiment can be referred to for details of the components.

With such a structure, the channel length of the transistor can be made longer as compared to the case where an oxide semiconductor layer is formed on a plane, so that a short channel effect can be suppressed. Thus, even when the semiconductor device is highly integrated by a decrease in the area of the semiconductor device as described in the above embodiment, a short channel effect can be suppressed in a transistor including an oxide semiconductor layer. Consequently, transistor characteristics can be improved.

Here, the oxide semiconductor layer 244 is processed into an island shape by the second trench 282. An insulating layer 274 is provided in contact with a side surface of the oxide semiconductor layer 244 and a bottom surface and an inner wall surface of the second trench 282. An insulating layer 272 is provided in contact with a bottom surface and an inner wall surface of the insulating layer 274. An insulating layer 270 is provided in contact with a bottom surface and an inner wall surface of the insulating layer 272 to fill the second trench 282. In other words, the second trench 282 including the insulating layers 270, 272, and 274 functions as an element isolation insulating layer of the oxide semiconductor layer 244. Thus, the second trench 282 including the insulating layers 270, 272, and 274 can be referred to as a shallow trench isolation (STI) region. Further, when the second trench 282 is deeper than the first trench 280 as described above, the oxide semiconductor layer 244 can be securely isolated. Note that the oxide semiconductor layer 244 is not necessarily isolated by the second trench 282. The oxide semiconductor layer 244 can be directly patterned into an island shape. In that case, the drain electrode 242b may be provided on an in contact with the connection electrode 230a, and the source electrode 242a may be provided on an in contact with the connection electrode 230b.

Here, insulating films with good step coverage are preferably used for the insulating layers 272 and 274. The insulating layers 272 and 274 can be formed using a material and a method that are similar to those of the gate insulating layer 146 in the above embodiment.

In this embodiment, a silicon oxide film of $SiO_{2+\alpha}$ ($\alpha>0$) is used for the insulating layer 274. With the use of the silicon oxide film for the insulating layer 274, oxygen can be supplied to the oxide semiconductor layer 244 and favorable characteristics can be obtained. In this embodiment, an aluminum oxide film is used for the insulating layer 272. Thus, a silicon oxide film of $SiO_{2+\alpha}$ ($\alpha>0$) covers the side surface of the oxide semiconductor layer 244 and the aluminum oxide film covers the silicon oxide film, so that oxygen in the silicon oxide film can be prevented from diffusing into and passing through the insulating layer 272.

The insulating layer 270 can be formed using a material and a method that are similar to those of the insulating layer 136 in the above embodiment. In order to efficiently perform filling with the insulating layer 270, the insulating layer 270 is particularly preferably formed by CVD or the like. When the insulating layers 274 and 272 are stacked in the second trench 282, the filling with the insulating layer 270 can be efficiently performed. The insulating layer 270 is preferably flattened by CMP treatment or the like after the filling with the insulating layer is performed.

In the case where a storage device including a plurality of arrayed memory cells (the semiconductor devices in FIGS. 9A and 9B) is formed, the planar shape of the second trench 282 may be a lattice pattern in which the plurality of memory cells are linked or a square shape in which the plurality of memory cells are independent. Further, in the case where the plurality of memory cells share the oxide semiconductor layer 244, the plurality of memory cells may surround the second trench 282.

A capacitor 264 includes the drain electrode 242b, the gate insulating layer 246, and a conductive layer 248b. Insulating layers 250 and 252 are provided over the transistor 262 and the capacitor 264. A wiring 254 is provided over the insulating layers 250 and 252 and is connected to the source electrode 242a through an opening formed in the gate insulating layer 246, the insulating layers 250 and 252, and the like. These components are similar to the components of the semiconductor device described in the above embodiment with reference to FIGS. 1A and 1B; thus, the above embodiment can be referred to for details of the components.

As in the above embodiment, in the semiconductor device in this embodiment, a connection electrode for connecting a transistor including a semiconductor material other than an oxide semiconductor to a transistor including an oxide semiconductor material is made smaller than an electrode of the transistor including a semiconductor material other than an oxide semiconductor that is connected to the connection electrode. Thus, the area of the transistor including an oxide semiconductor material that is connected to the connection electrode can be decreased, so that a semiconductor device with a novel structure can be highly integrated and storage capacity per unit area can be increased.

In the semiconductor device in this embodiment, an oxide semiconductor layer of the transistor including an oxide semiconductor material is provided to be in contact with a bottom surface and an inner wall surface of a trench formed in an insulating layer. Thus, the channel length of the transistor can be made longer as compared to the case where an oxide semiconductor layer is formed on a plane, so that a short channel effect of the transistor can be suppressed while the semiconductor device is highly integrated.

As described above, the structures, methods, and the like described in this embodiment can be combined with any of the structures, methods, and the like described in the other embodiments as appropriate.

Embodiment 4

In this embodiment, applications of a semiconductor device according to one embodiment of the disclosed invention are described with reference to FIGS. 10A and 10B.

Figure 10A:
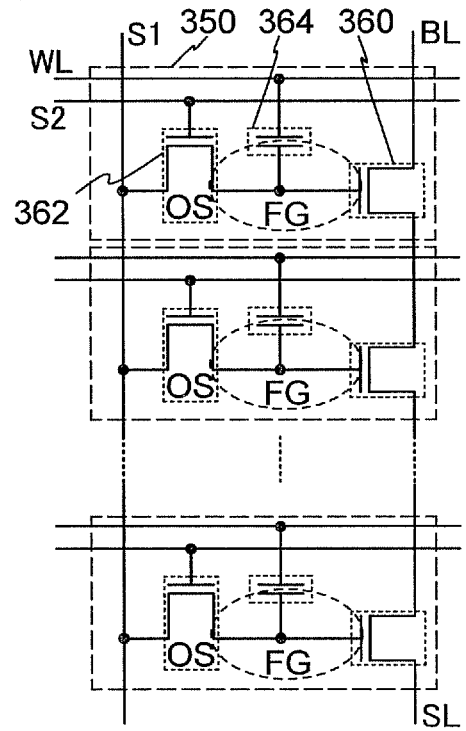
FIGS. 10A and 10B are circuit diagrams of a semiconductor device.
Figure 10B:
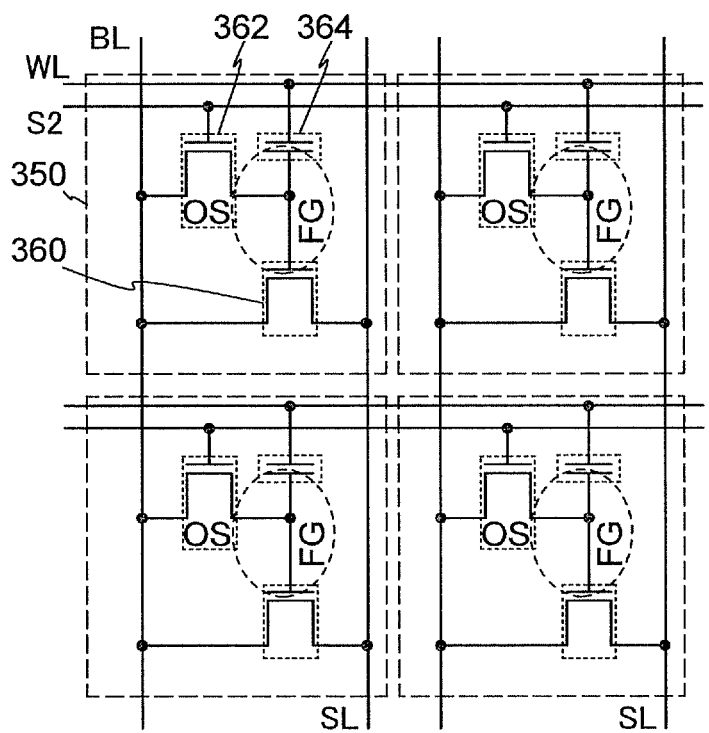

FIGS. 10A and 10B are circuit diagrams of semiconductor devices each including the plurality of semiconductor devices in the above embodiment (hereinafter also referred to as memory cells 350). FIG. 10A is a circuit diagram of a so-called NAND semiconductor device in which the memory cells 350 are connected in series. FIG. 10B is a circuit diagram of a so-called NOR semiconductor device in which the memory cells 350 are connected in parallel.

The semiconductor device in FIG. 10A includes a source line SL, a bit line BL, a first signal line S1, a plurality of second signal lines S2, a plurality of word lines WL, and the plurality of memory cells 350. Specifically, each of the memory cells 350 in FIG. 10A corresponds to the circuit diagram in FIG. 2A. The source line SL, the bit line BL, the first signal line S1, the second signal line S2, and the word line WL correspond to the first wiring, the second wiring, the third wiring, the fourth wiring, and the fifth wiring, respectively. Each of the memory cells 350 includes transistors 360 and 362 and a capacitor 364. The transistor 360 corresponds to the transistor 160 or the transistor 260 in the above embodiment. The transistor 362 corresponds to the transistor 162 or the transistor 262 in the above embodiment. The capacitor 364 corresponds to the capacitor 164 or the capacitor 264 in the above embodiment.

In FIG. 10A, one source line SL and one bit line BL are provided; however, this embodiment is not limited thereto. A plurality of source lines SL and a plurality of bit lines BL may be provided.

In each of the memory cells 350, a gate electrode of the transistor 360, one of a source electrode and a drain electrode of the transistor 362, and one electrode of the capacitor 364 are electrically connected to each other. The first signal line S1 and the other of the source electrode and the drain electrode of the transistor 362 are electrically connected to each other. The second signal line S2 and a gate electrode of the transistor 362 are electrically connected to each other. The word line WL and the other electrode of the capacitor 364 are electrically connected to each other.

Further, a source electrode of the transistor 360 included in the memory cell 350 is electrically connected to a drain electrode of the transistor 360 in the adjacent memory cell 350. A drain electrode of the transistor 360 included in the memory cell 350 is electrically connected to a source electrode of the transistor 360 in the adjacent memory cell 350. Note that the drain electrode of the transistor 360 included in the memory cell 350 of the plurality of memory cells connected in series that is provided at one end is electrically connected to the bit line BL. In addition, the source electrode of the transistor 360 included in the memory cell 350 at the other end of the plurality of memory cells connected in series is electrically connected to the source line SL.

In the semiconductor device in FIG. 10A, writing operation and reading operation are performed in each row. The writing operation is performed as follows. A potential at which the transistor 362 is turned on is applied to the second signal line S2 in a row to which data is written, so that the transistor 362 in the row to which data is written is turned on. Thus, the potential of the first signal line S1 is applied to the gate electrode of the transistor 360 in the specified row, so that predetermined electric charge is given to the gate electrode. Consequently, data can be written to the memory cell in the specified row.

Further, the reading operation is performed as follows. First, a potential at which the transistor 360 is turned on regardless of the electric charge given to the gate electrode of the transistor 360 is applied to the word lines WL in rows other than a row from which data is read, so that the transistors 360 in the rows other than the row from which data is read are turned on. Then, a potential (reading potential) at which on or off of the transistors 360 is determined by the electric charge in the gate electrode of the transistor 360 is applied to the word line WL in the row from which data is read. After that, a constant potential is applied to the source line SL so that a reading circuit (not illustrated) connected to the bit line BL is operated. Here, the plurality of transistors 360 between the source line SL and the bit line BL are turned on except the transistor 360 in the row from which data is read. Thus, conductance between the source line SL and the bit line BL depends on the state (on or off) of the transistor 360 in the row from which data is read. Since the conductance of the transistor varies depending on the electric charge in the gate electrode of the transistor 360 in the row from which data is read, the potential of the bit line BL varies accordingly. When the potential of the bit line BL is read by the reading circuit, data can be read from the memory cell in the specified row.

The semiconductor device in FIG. 10B includes the plurality of source lines SL, the plurality of bit lines BL, the plurality of second signal lines S2, the plurality of word lines WL, and the plurality of memory cells 350. Here, the bit line BL in FIG. 10B functions as both the bit line BL and the signal line S1 in FIG. 10A. Needless to say, this embodiment is not limited thereto. The bit line BL and the first signal line 51 may be separately provided. Specifically, each of the memory cells 350 in FIG. 10B corresponds to the circuit diagram in FIG. 2B. The source line SL, the bit line BL, the second signal line S2, and the word line WL correspond to the first wiring, a wiring in which the second wiring and the third wiring are connected to each other, the fourth wiring, and the fifth wiring, respectively. Each of the memory cells 350 includes the transistors 360 and 362 and the capacitor 364. The transistor 360 corresponds to the transistor 160 or the transistor 260 in the above embodiment. The transistor 362 corresponds to the transistor 162 or the transistor 262 in the above embodiment. The capacitor 364 corresponds to the capacitor 164 or the capacitor 264 in the above embodiment. The bit line BL corresponds to the wiring 154 in FIG. 1A (the wiring 254 in FIG. 9A).

The gate electrode of the transistor 360, one of the source electrode and the drain electrode of the transistor 362, and one electrode of the capacitor 364 are electrically connected to each other. The source line SL and the source electrode of the transistor 360 are electrically connected to each other. The bit line BL and the drain electrode of the transistor 360 are electrically connected to each other. The bit line BL and the other of the source electrode and the drain electrode of the transistor 362 are electrically connected to each other. The second signal line S2 and the gate electrode of the transistor 362 are electrically connected to each other. The word line WL and the other electrode of the capacitor 364 are electrically connected to each other. In other words, in each of the memory cells 350 in FIG. 10B, the other of the source electrode and the drain electrode of the transistor 362 is connected in parallel with the bit line BL.

In the semiconductor device in FIG. 10B, writing operation and reading operation are performed in each row. The writing operation is performed in a manner similar to that in the semiconductor device in FIG. 10A. The reading operation is performed as follows. First, a potential at which the transistor 360 is turned off regardless of electric charge given to the gate electrode of the transistor 360 is applied to the word lines WL in rows other than a row from which data is read, so that the transistors 360 in the rows other than the row from which data is read are turned off. Then, a potential (reading potential) at which on or off of the transistors 360 is determined by the electric charge in the gate electrode of the transistor 360 is applied to the word line WL in the row from which data is read. After that, a constant potential is applied to the source line SL so that a reading circuit (not illustrated) connected to the bit line BL is operated. Here, conductance between the source line SL and the bit line BL depends on the state (on or off) of the transistor 360 in the row from which data is read. In other words, the potential of the bit line BL varies depending on the electric charge in the gate electrode of the transistor 360 in the row from which data is read. When the potential of the bit line BL is read by the reading circuit, data can be read from the memory cell in the specified row.

Note that although the amount of data retained in each of the memory cells 350 is one bit in the above description, the structure of the storage device in this embodiment is not limited thereto. The amount of data retained in each of the memory cells 350 may be increased by preparing three or more potentials to be applied to the gate electrode of the transistor 360. For example, in the case where the number of potentials to be applied to the gate electrode of the transistor 360 is four, 2-bit data can be retained in each of the memory cells.

As described in the above embodiment, a connection electrode for connecting a transistor including a semiconductor material other than an oxide semiconductor to a transistor including an oxide semiconductor material is made smaller than an electrode of the transistor including a semiconductor material other than an oxide semiconductor that is connected to the connection electrode. Thus, the area of the transistor including an oxide semiconductor material that is connected to the connection electrode can be decreased. In other words, the area of each of the memory cells 350 in FIGS. 10A and 10B can be decreased. Consequently, such a structure is very effective in a semiconductor device including a plurality of memory cells because the area can be decreased in accordance with the number of memory cells.

In particular, in a semiconductor device with the structure in FIG. 10B, the area of a portion where the gate electrode of the transistor 360 and one of the source electrode and the drain electrode of the transistor 362 are in contact with each other in each of the memory cells 350 and the area of a portion where the drain electrode of the transistor 360 and the other of the source electrode and the drain electrode of the transistor 362 are in contact with each other can be decreased.

When the area of each memory cell is decreased, a semiconductor device with a novel structure can be highly integrated and storage capacity per unit area can be increased.

The structures, methods, and the like described in this embodiment can be combined with any of the structures, methods, and the like described in the other embodiments as appropriate.

Embodiment 5

In this embodiment, applications of the semiconductor device in the above embodiment to electronic devices are described with reference to FIGS. 11A to 11F. In this embodiment, applications of the semiconductor device to electronic devices such as a computer, a cellular phone handset (also referred to as a cellular phone or a cellular phone device), a personal digital assistant (including a portable game machine, an audio reproducing device, and the like), a camera such as a digital camera or a digital video camera, electronic paper, and a television set (also referred to as a television or a television receiver) are described.

Figure 11A:
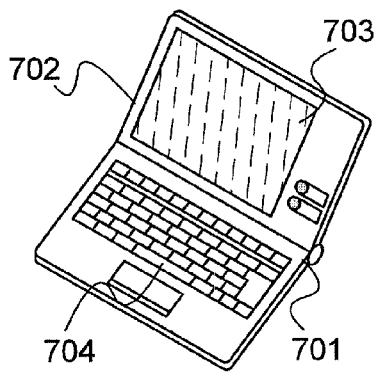
FIGS. 11A to 11F illustrate electronic devices each including a semiconductor device.

FIG. 11A is a laptop, which includes a housing 701, a housing 702, a display portion 703, a keyboard 704, and the like. The semiconductor device in the above embodiment is provided in at least one of the housing 701 and the housing 702. Thus, a laptop in which data is written and read at high speed, data is retained for a long time, and power consumption is sufficiently reduced can be obtained.

Figure 11D:
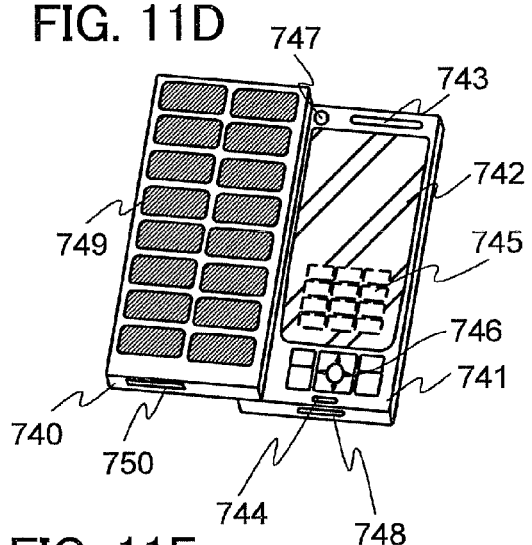
Figure 11B:
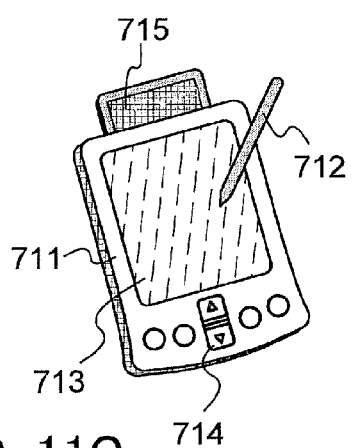

FIG. 11B is a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device in the above embodiment is provided. Thus, a personal digital assistant in which data is written and read at high speed, data is retained for a long time, and power consumption is sufficiently reduced can be obtained.

Figure 11E:
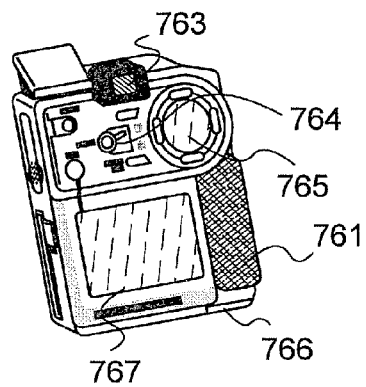
Figure 11C:
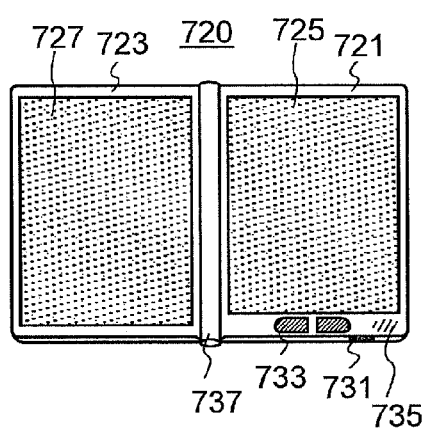

FIG. 11C is an e-book reader provided with electronic paper. An e-book reader 720 has two housings 721 and 723. The housing 721 and the housing 723 include a display portion 725 and a display portion 727, respectively. The housings 721 and 723 are connected to each other with a hinge 737 and can be opened and closed with the hinge 737 used as an axis. The housing 721 is provided with a power switch 731, operation keys 733, a speaker 735, and the like. At least one of the housings 721 and 723 is provided with the semiconductor device in the above embodiment. Thus, an e-book reader in which data is written and read at high speed, data is retained for a long time, and power consumption is sufficiently reduced can be obtained.

FIG. 11D is a cellular phone handset, which includes two housings 740 and 741. Further, the housings 740 and 741 which are developed as illustrated in FIG. 11D can overlap with each other by sliding; thus, the size of the cellular phone handset can be decreased, which makes the cellular phone handset suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for storing electricity in the cellular phone handset, an external memory slot 750, and the like. In addition, an antenna is incorporated in the housing 741. The display panel 742 includes a touch panel. Operation keys 745 which are displayed as images are indicated by dashed lines in FIG. 11D. At least one of the housings 740 and 741 is provided with the semiconductor device in the above embodiment. Thus, a cellular phone handset in which data is written and read at high speed, data is retained for a long time, and power consumption is sufficiently reduced can be obtained.

FIG. 11E is a digital camera, which includes a main body 761, a display portion 767, an eyepiece 763, an operation switch 764, a display portion 765, a battery 766, and the like. In the main body 761, the semiconductor device in the above embodiment is provided. Thus, a digital camera in which data is written and read at high speed, data is retained for a long time, and power consumption is sufficiently reduced can be obtained.

Figure 11F:
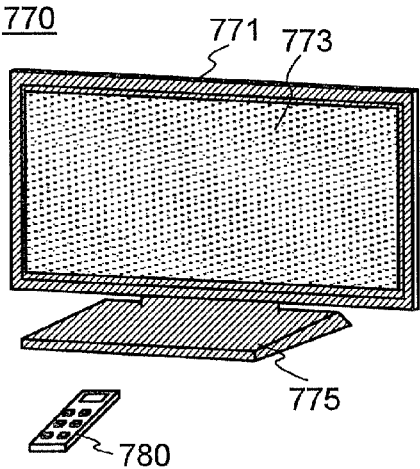

FIG. 11F is a television set. A television set 770 includes a housing 771, a display portion 773, a stand 775, and the like. The television set 770 can be operated with an operation switch of the housing 771 or a remote control 780. The semiconductor device in the above embodiment is mounted on the housing 771 and the remote control 780. Thus, a television set in which data is written and read at high speed, data is retained for a long time, and power consumption is sufficiently reduced can be obtained.

As described above, the electronic devices described in this embodiment each include the semiconductor device according to the above embodiment. Thus, low-power electronic devices can be obtained This application is based on Japanese Patent Application serial No. 2011-048103 filed with Japan Patent Office on Mar. 4, 2011, the entire contents of which are hereby incorporated by reference.

What is claimed is:

1. A semiconductor device comprising:
   a substrate containing a semiconductor material;
   a first transistor formed using the semiconductor material, the first transistor including a channel formation region, a source region, a drain region, a first gate insulating layer, and a first gate electrode;
   an insulating layer formed over the first transistor;
   a second transistor formed over the insulating layer, the second transistor including an oxide semiconductor layer, a source electrode, a drain electrode, a second gate insulating layer, and a second gate electrode;
   a first connection electrode;
   a second connection electrode; and a third connection electrode formed over the second connection electrode,
wherein one of the source electrode and the drain electrode is electrically connected to the first gate electrode with the first connection electrode interposed therebetween,
wherein the other of the source electrode and the drain electrode is electrically connected to one of the source region and the drain region with the second connection electrode and the third connection electrode interposed therebetween, and
wherein the oxide semiconductor layer overlaps with at least a part of the source region or the drain region.

2. The semiconductor device according to claim 1, wherein a length of the first connection electrode in a channel width direction of the first transistor is shorter than a length of the first gate electrode in the channel width direction of the first transistor.

3. The semiconductor device according to claim 1, wherein a length of the third connection electrode in a channel length direction of the first transistor is shorter than a length of the second connection electrode in the channel length direction of the first transistor.

4. The semiconductor device according to claim 1, wherein a part of the oxide semiconductor layer overlaps with the second connection electrode.

5. The semiconductor device according to claim 1, wherein the length of the third connection electrode in the channel width direction of the first transistor is substantially equal to the length of the first connection electrode in the channel width direction of the first transistor.

6. The semiconductor device according to claim 1,
wherein the insulating layer is a stack of a first insulating layer and a second insulating layer,
wherein the first insulating layer is formed on the same layer as the first gate electrode and the second connection electrode,
wherein the second insulating layer is formed on the same layer as the first connection electrode and the third connection electrode, and
wherein a proportion of oxygen in the second insulating layer is higher than a proportion of oxygen in the first insulating layer.

7. The semiconductor device according to claim 1, wherein a capacitor is constituted by one of the source electrode and the drain electrode, the second gate insulating layer, and a conductive layer.

8. The semiconductor device according to claim 1, wherein the semiconductor material includes silicon.

9. The semiconductor device according to claim 1, wherein the oxide semiconductor layer includes an oxide semiconductor material containing In, Ga, and Zn.

10. A semiconductor device comprising the plurality of semiconductor devices according to claim 1, wherein the plurality of semiconductor devices is electrically connected to a wiring provided over the second transistor in parallel.

11. A semiconductor device comprising:
a substrate containing a semiconductor material;
a first transistor formed using the semiconductor material, the first transistor including a channel formation region, a source region, a drain region, a first gate insulating layer, and a first gate electrode;
an insulating layer formed over the first transistor;
a second transistor formed over the insulating layer, the second transistor including an oxide semiconductor layer, a source electrode, a drain electrode, a second gate insulating layer, and a second gate electrode;
a first connection electrode;
a second connection electrode; and
a third connection electrode formed over the second connection electrode,
wherein the first connection electrode is provided between the first gate electrode and one of the source electrode and the drain electrode,
wherein the second connection electrode and the third connection electrode are provided between one of the source region and the drain region and the other of the source electrode and the drain electrode,
wherein one of the source electrode and the drain electrode is electrically connected to the first gate electrode with the oxide semiconductor layer interposed therebetween,
wherein the other of the source electrode and the drain electrode is electrically connected to one of the source region and the drain region with the oxide semiconductor layer interposed therebetween, and
wherein the oxide semiconductor layer overlaps with at least a part of the source region or the drain region.

12. The semiconductor device according to claim 11, wherein a length of the first connection electrode in a channel length direction of the first transistor is shorter than a length of the first gate electrode in the channel length direction of the first transistor.

13. The semiconductor device according to claim 11, wherein a length of the third connection electrode in a channel width direction of the first transistor is shorter than a length of the second connection electrode in the channel width direction of the first transistor.

14. The semiconductor device according to claim 11, wherein a part of the oxide semiconductor layer overlaps with the second connection electrode.

15. The semiconductor device according to claim 11, wherein the length of the third connection electrode in the channel width direction of the first transistor is substantially equal to the length of the first connection electrode in the channel width direction of the first transistor.

16. The semiconductor device according to claim 11,
wherein the insulating layer is a stack of a first insulating layer and a second insulating layer,
wherein the first insulating layer is formed on the same layer as the first gate electrode and the second connection electrode,
wherein the second insulating layer is formed on the same layer as the first connection electrode and the third connection electrode, and
wherein a proportion of oxygen in the second insulating layer is higher than a proportion of oxygen in the first insulating layer.

17. The semiconductor device according to claim 11, wherein a capacitor is constituted by one of the second source electrode and the second drain electrode, the second gate insulating layer, and a conductive layer.

18. The semiconductor device according to claim 11, wherein the semiconductor material includes silicon.

19. The semiconductor device according to claim 11, wherein the oxide semiconductor layer includes an oxide semiconductor material containing In, Ga, and Zn.

20. The semiconductor device according to claim 11,
wherein a trench is provided over the insulating layer,
wherein the oxide semiconductor layer is provided in contact with a bottom surface and an inner wall surface of the trench.

21. A semiconductor device comprising the plurality of semiconductor devices according to claim 11, wherein the plurality of semiconductor devices is electrically connected to a wiring provided over the second transistor in parallel.

* * * * *

UNITED STATES PATENT AND TRADEMARK OFFICE
CERTIFICATE OF CORRECTION

PATENT NO.         : 8,809,853 B2
APPLICATION NO.    : 13/409316
DATED              : August 19, 2014
INVENTOR(S)        : Toshihiko Saito et al.

Page 1 of 1

It is certified that error appears in the above-identified patent and that said Letters Patent is hereby corrected as shown below:

In The Specification

At column 14, line 37, "determined" should be --determined.--;

At column 18, line 41, "SOT" should be --SOI--;

At column 36, line 4, "51" should be --S1--.

Signed and Sealed this
Twentieth Day of January, 2015

Michelle K. Lee
*Deputy Director of the United States Patent and Trademark Office*